United States Patent [19]
Saitoh et al.

[11] Patent Number: 5,644,245
[45] Date of Patent: Jul. 1, 1997

[54] PROBE APPARATUS FOR INSPECTING ELECTRICAL CHARACTERISTICS OF A MICROELECTRONIC ELEMENT

[75] Inventors: Satoshi Saitoh; Akihiro Terada, both of Tokyo, Japan

[73] Assignees: Tokyo Electron Limited; Tokyo Electron FE Limited, both of Tokyo, Japan

[21] Appl. No.: 347,138

[22] Filed: Nov. 23, 1994

[30] Foreign Application Priority Data

| Nov. 24, 1993 | [JP] | Japan | 5-292960 |
| Apr. 18, 1994 | [JP] | Japan | 6-103331 |
| May 17, 1994 | [JP] | Japan | 6-126898 |

[51] Int. Cl.⁶ .................................................. G01R 31/02
[52] U.S. Cl. ........................................ 324/754; 324/758
[58] Field of Search .............................. 324/750, 765, 324/757, 758, 754, 73.1, 158.1; 437/8; 348/141, 126, 135, 87, 94; 382/8

[56] References Cited

U.S. PATENT DOCUMENTS

| 4,786,867 | 11/1988 | Yamatsu | 324/758 |
| 4,929,893 | 5/1990 | Sato et al. | 324/758 |
| 4,934,064 | 6/1990 | Yamaguchi et al. | 324/758 |
| 4,965,515 | 10/1990 | Karasawa | 324/73.1 |
| 5,436,571 | 7/1995 | Karasawa | 324/765 |

FOREIGN PATENT DOCUMENTS

| 61-228638 | 10/1986 | Japan . |
| 2-224260 | 9/1990 | Japan . |
| 4-340241 | 11/1992 | Japan . |

*Primary Examiner*—Vinh P. Nguyen
*Attorney, Agent, or Firm*—Oblon, Spivak, McClelland, Maier & Neustadt, P.C.

[57] ABSTRACT

A probe apparatus for inspecting electrical characteristics of a microelectronic element formed on a substrate and having a plurality of pads including a probe card having a plurality of probe needles, an image pick-up device for picking up images of the pads and the probe needles, a registration device which previously stores pad position information indicating pad positions of at least specified of the pads and needle position information indicating needle positions of at least specified of the plurality of probe needles, the needle positions being obtained by an actual measurement based on the images picked up by the image pick-up device, and a control processor for executing a task for detecting imaginary needle marks formed on the pads by imaginarily bringing the specified probe needles and the pads corresponding thereto into contact with each other, by overlapping the first position information and the pad position information of the microelectronic element, a task for detecting positional deviation information indicating a positional deviation between the needle marks and the pads, and a task for correcting a positional deviation between the pads and the probe needles in accordance with the positional deviation information.

17 Claims, 13 Drawing Sheets

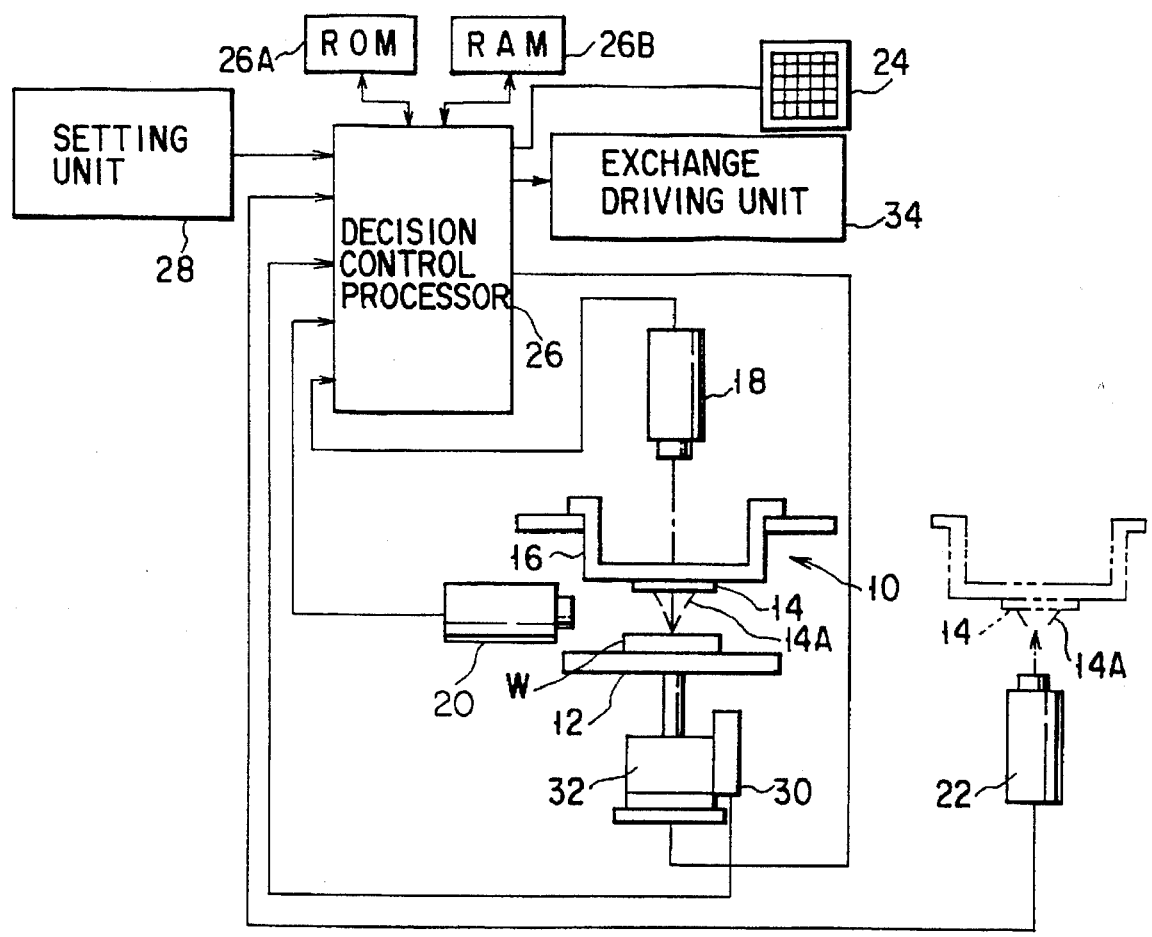
F I G. 1
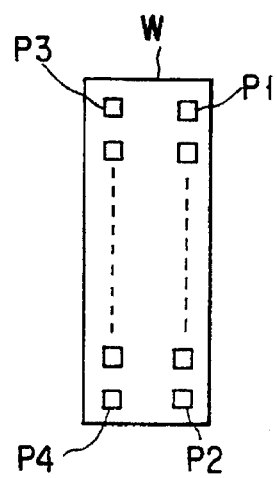
F I G. 2

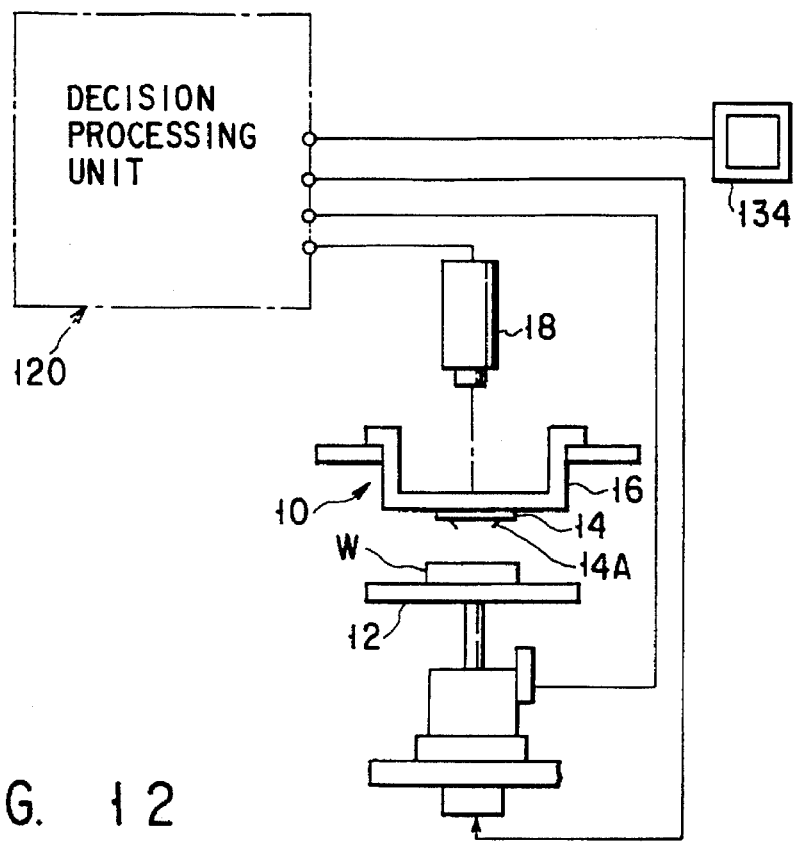
F I G. 12
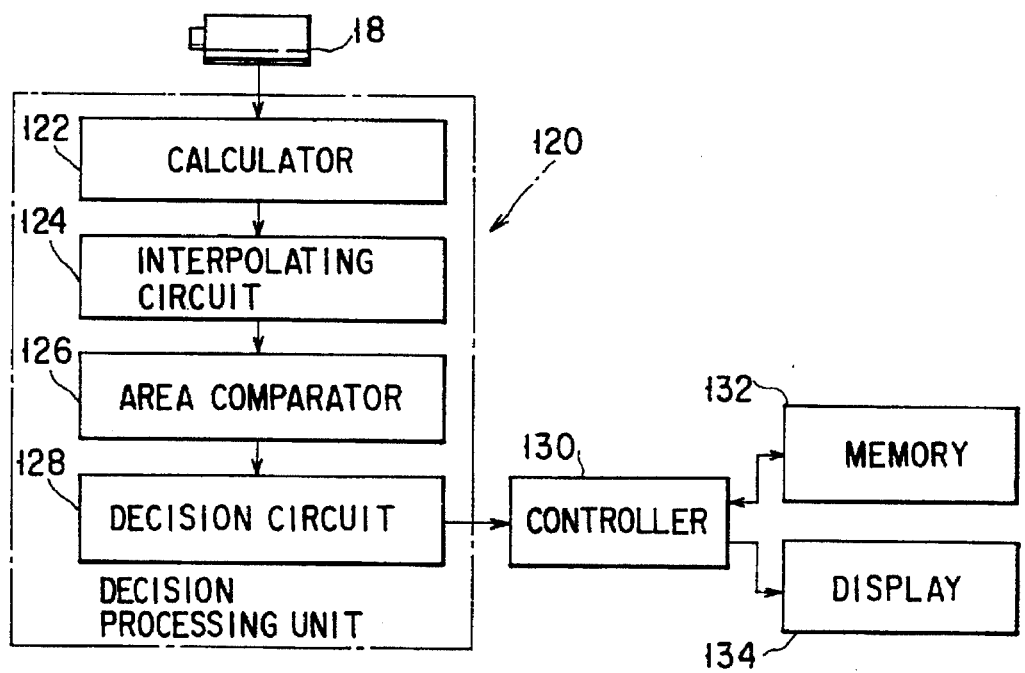
F I G. 13

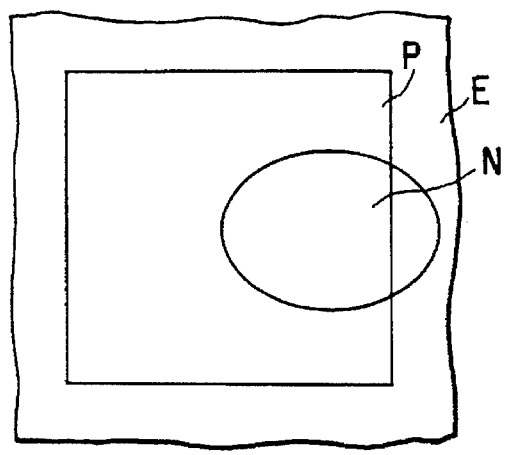
F I G. 14
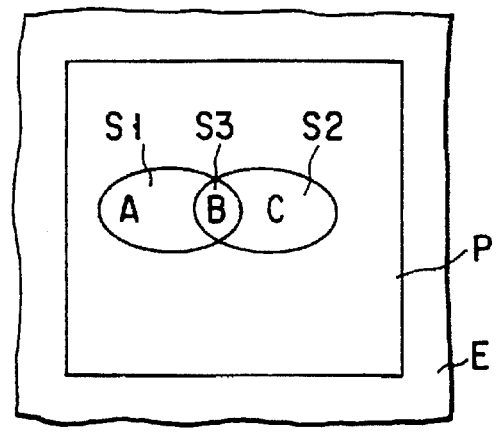
F I G. 15
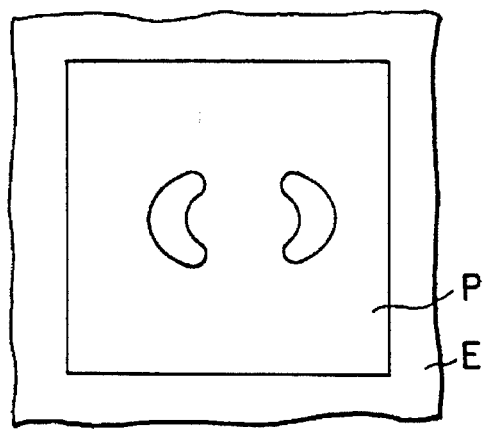
F I G. 16
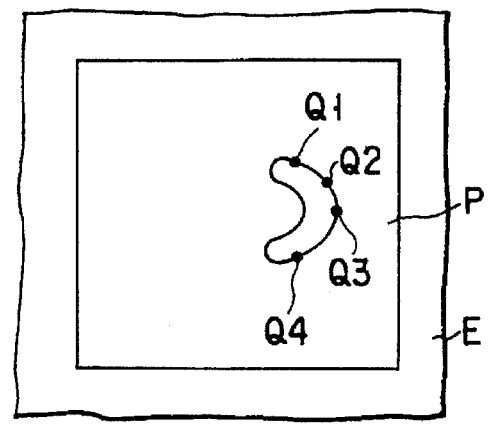
F I G. 17

PROBE APPARATUS FOR INSPECTING ELECTRICAL CHARACTERISTICS OF A MICROELECTRONIC ELEMENT

BACKGROUND OF THE INVENTION

1. Field of the Invention

The present invention relates to a probing method and a probe apparatus.

2. Description of the Related Art

As is known, in the manufacturing process of a semiconductor wafer and the like, probe inspecting steps of inspecting the electrical characteristics of the manufactured semiconductor wafer on the wafer are performed.

An apparatus used for the probe inspecting steps has a structure in which the above characteristics are measured by bringing probe needles into contact with the electrode pads of each of a large number of elements, e.g., integrated circuit chips, on the semiconductor wafer and connecting the probe needles to a tester.

Therefore, the semiconductor wafer is kept held on a wafer chuck, e.g., a vacuum chuck. Alignment of the electrode pads and probe needles, i.e., setup, is performed by adjusting the position of the wafer chuck in the X and Y directions and the θ direction which is the rotating direction around the Z axis.

When measurement is actually performed, the wafer chuck is moved upward to obtain contact between the electrode pads and probe needles, and thereafter the wafer chuck is further moved upward, i.e., is over-driven to remove oxide films on the surface of the element, thereby assuring contact between the electrode pads and probe needles.

Alignment of the electrode pads of a circuit chip of the semiconductor wafer and the probe needles described above is executed when the type of the circuit chip as the measurement target is altered or when the type of the probe needles is altered in accordance with this type alteration.

This alignment must have a very small precision displacement. Conventionally, position adjustment is mainly performed by an operator's manual operation. More specifically, the operator performs alignment while observing the contact state of the probe needles with the electrode pads of the circuit chip by using a microscope or the like. Accordingly, this operation naturally requires a high skill.

Alignment requires a skill due to the following reasons. Namely, a probe card incorporating probe needles has an inclination in the rotating direction, i.e., has a position displacement that needs so-called correction. The position of an electrode pad of an integrated circuit chip is displaced from the position of a corresponding probe needle of the probe card. Since the number and pitch of pins of the circuit chip have increased, it is difficult to align all the electrode pads with the needles of the probe card at once.

It is thus demanded to automate this alignment process. However, to execute the alignment automatically, the following requirements must be satisfied.

A probe needle sometimes causes a contact failure due to deterioration over time. More specifically, due to wear, deformation, breakdown and the like of the needle point, the distance from the needle point to the electrode pad changes, and an appropriate contact state cannot be maintained.

For this reason, a probe card incorporating probe needles must maintain a fixed positional relationship between the electrode pads and probe needles not only when the type of the circuit chip is altered but also when circuit chips of the same type are to be inspected. Naturally, the probe needles are preferably exchanged after every predetermined cycle considering the service life of the probe needles, which is shortened by wear and the like.

It is, therefore, preferable in terms of the original purpose of automation that the alignment be automatically performed in every case including the above case of probe card exchange.

SUMMARY OF THE INVENTION

It is an object of the present invention to provide a probing method capable of automatically aligning the probe needles of a probe card with the electrode pads of an integrated circuit chip not only when the type of the integrated circuit chip and the like is altered but also when the probe card is exchanged, and a probe apparatus using the same.

According to the present invention, there is provided a probing method of continuously inspecting electrical characteristics of a microelectronic element formed on a substrate and having a plurality of pads, which includes a step of preparing a probe card having a plurality of probe needles, a first registration step of registering first position information indicating positions actually measured, of at least several specific probe needles of the plurality of probe needles, a first detection step of virtually bringing the specific probe needles and corresponding pads into contact with each other, based on the first position information and preset pad position information of the microelectronic element, and detecting needle marks virtually formed on the pads thereby, a second detection step of detecting first position displacement information indicating a position displacement of the needle marks from positions of the pads, and a first correction step of correcting a positional condition under which the pads and the specific probe needles are brought into contact with each other, based on the position displacement information.

According to the present invention, there is provided the probing method further including a second registration step of registering second position information indicating positions actually measured, of arbitrary probe needles other than the specific probe needles, a third detection step of virtually bringing the arbitrary probe needles and the pads into contact with each other, based on the second position information and preset pad position information, and detecting needle marks virtually formed on the pads thereby, a fourth detection step of detecting second position displacement information indicating a position displacement between the arbitrary probe needles and the pads corresponding to the probe needles, based on image recognition of the needle marks, and a second correction step of correcting a positional condition under which the arbitrary probe needles and the pads corresponding to the probe needles are brought into contact with each other, based on the second position displacement information.

According to the present invention, there is a probe apparatus for continuously inspecting electrical characteristics of a microelectronic element formed on a substrate and having a plurality of pads, comprising means for holding a probe card having a plurality of probe needles, first registration means for registering first position information indicating positions, which are actually measured, of at least several specific probe needles of the plurality of probe needles, first detection means for virtually bringing the specific probe needles and corresponding pads into contact with each other, based on the first position information and preset pad position information of the microelectronic element, and detecting needle marks virtually formed on the pads thereby, second detection means for detecting first position displacement information indicating a position displacement of the needle marks from positions of the pads, and first correction means for correcting a positional condition under which the pads and the specific probe needles are brought into contact with each other, based on the position displacement information.

In the above probing apparatus, the second registration means registers second position information indicating positions, which are actually measured, of arbitrary probe needles other than the specific probe needles, and the first detection means brings virtually the arbitrary probe needles and the pads into contact with each other, based on the second position information and preset pad position information, and detects needle marks virtually formed on the pads thereby. The second detection means detects second position displacement information indicating a position displacement between the arbitrary probe needles and the pads corresponding to the probe needles, based on image recognition of the needle marks. The correction means corrects a positional condition under which the arbitrary probe needles and the pads corresponding to the probe needles are brought into contact with each other, based on the second position displacement information.

According to the present invention, since position displacement information can be obtained from the virtual contact state of the pads and the probe needles, not only the actual contact state of the pads and the probe needles can be virtually monitored in advance, but also this contact state can be corrected to an optimum state based on the result of the actual contact state. Therefore, the contact state of the pads and the probe needles is prevented from actually being in a so-called defective state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a schematic block diagram of a probe apparatus used in a probing method according to an embodiment of the present invention;

FIG. 2 is a plan view of an element used for the probing method of the present invention;

FIG. 12 is a schematic block diagram of a probe apparatus according to another embodiment of the present invention;

FIG. 13 is a block diagram of a control system used in the probe apparatus shown in FIG. 12;

FIG. 14 is a diagram showing a formation state of a needle mark;

FIG. 15 is a diagram showing another formation state of the needle mark;

FIG. 16 is a diagram showing still another formation state of the needle mark;

FIG. 17 is a diagram showing still another formation state of the needle mark;

DETAILED DESCRIPTION OF THE PREFERRED EMBODIMENTS

Figure 3:
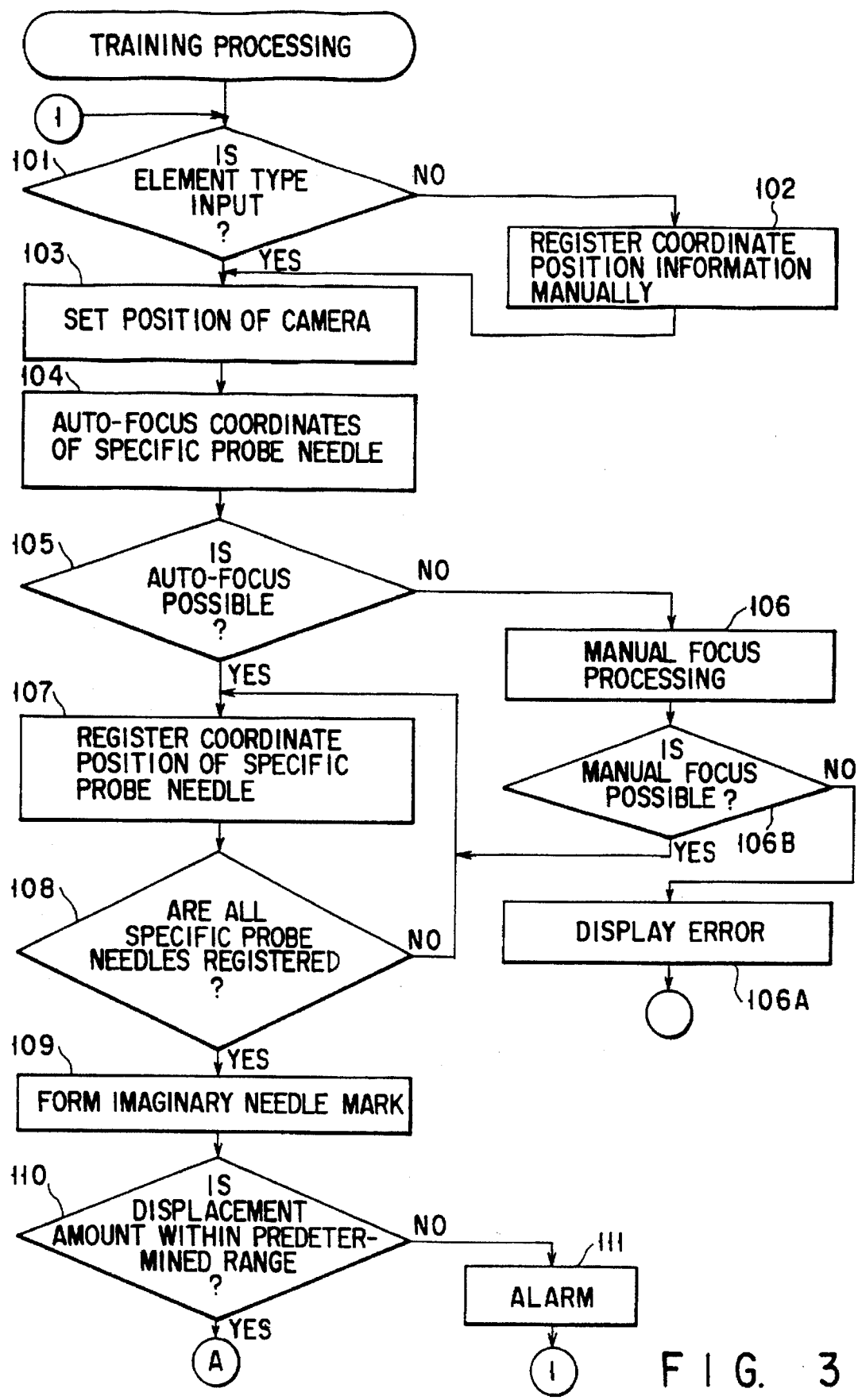
FIG. 3 is a flow chart for explaining the operation of the probe apparatus shown in FIG. 1.
Figure 4:
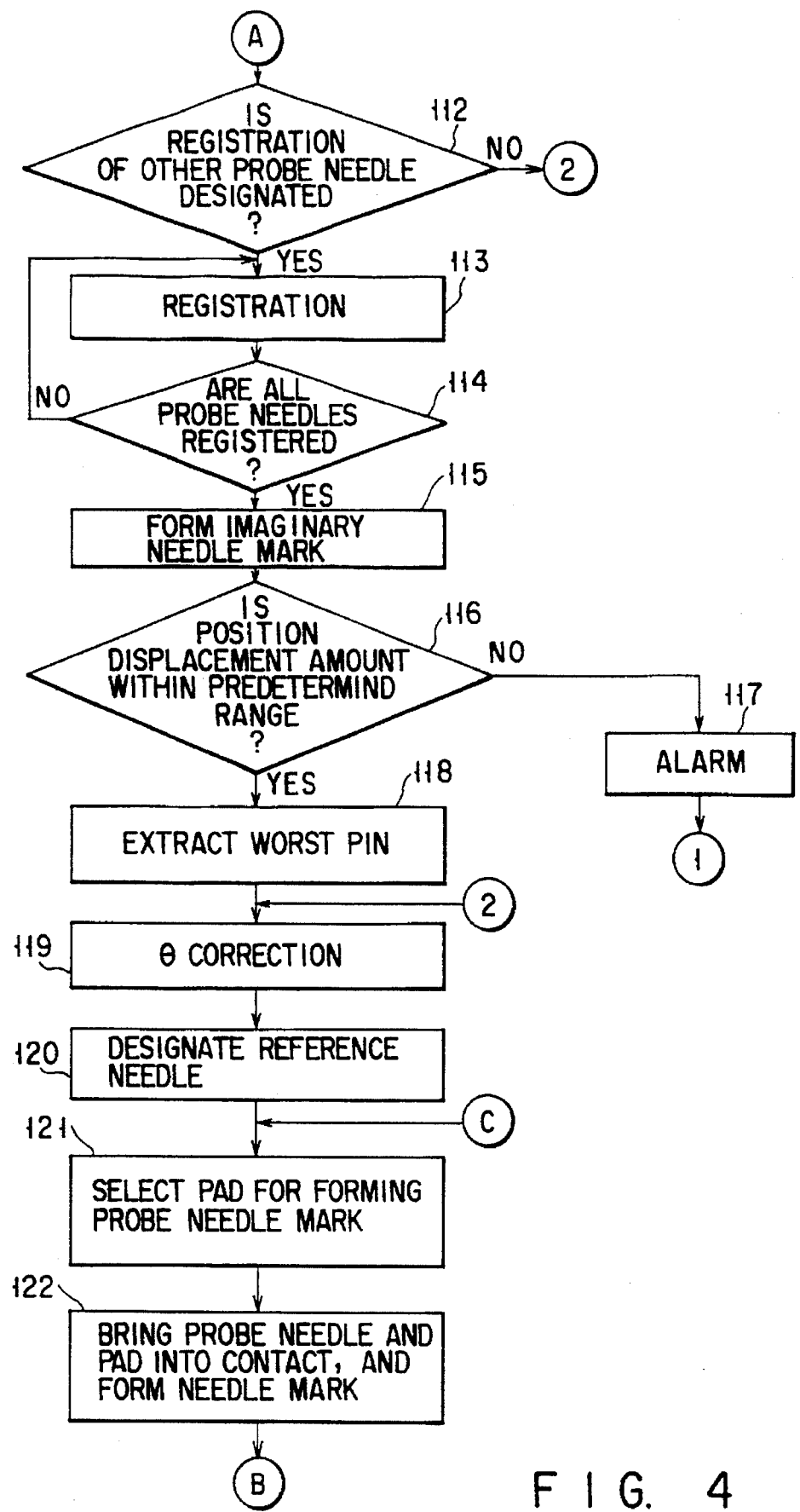
FIG. 4 is a flow chart for explaining another operation of the probe apparatus shown in FIG. 1.
Figure 5:
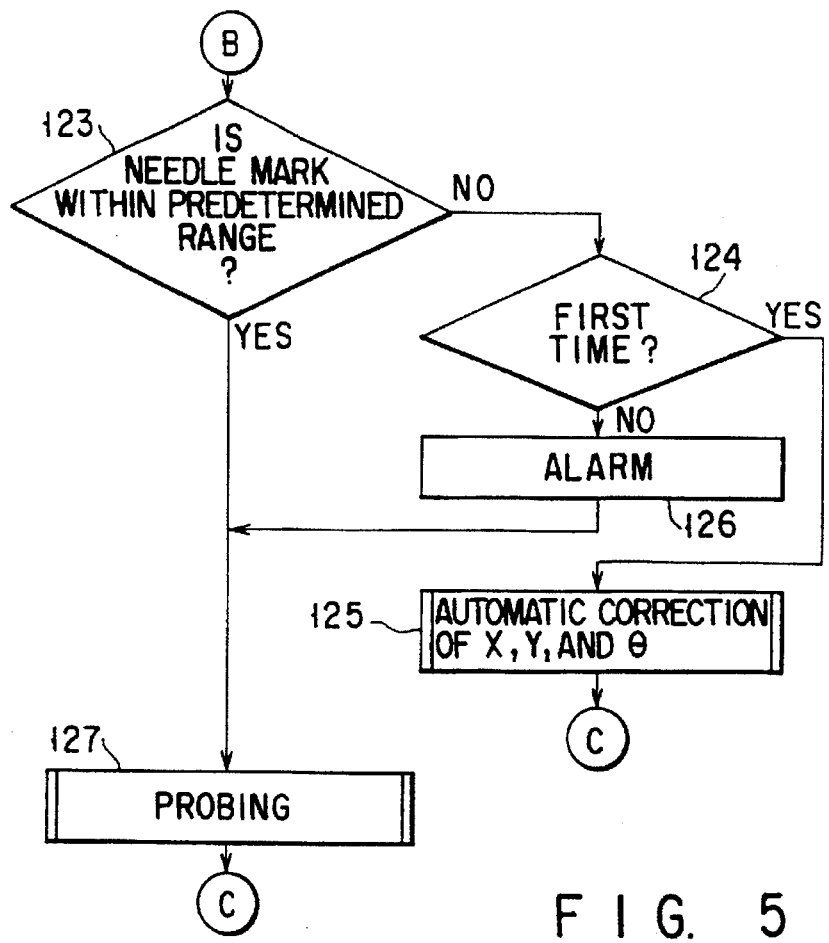
FIG. 5 is a flow chart for explaining still other operation of the probe apparatus shown in FIG. 1.

The present invention will be described in detail by way of the preferred embodiments shown in the accompanying drawings.

FIG. 1 schematically shows a probe apparatus to which a probing method according to the present invention is applied.

The characteristic feature of this embodiment is that a position displacement condition can be corrected based on the result of virtual contact obtained in advance prior to setup executed in continuous inspections.

A probe apparatus 10 will be described. As is known, the probe apparatus 10 is used for inspecting the electrical characteristics of a microelectronic element, e.g., an integrated circuit chip, on a semiconductor wafer W. The probe apparatus 10 has a wafer chuck 12 on which the semiconductor wafer W to be subjected to this inspection is placed, and a probe card 14 having probe needles 14A that can be brought into contact with the electrode pads of the integrated circuit chip on the semiconductor wafer.

The wafer chuck 12 is movable in the X, Y, Z, and θ directions where the X and Y axes are orthogonal axes on the wafer chuck 12, the Z axis indicates the vertical direction, and θ indicates the rotating direction around the Z axis.

The wafer chuck 12 has a mechanism for vacuum-chucking the semiconductor wafer W placed thereon, and can move in the above directions while holding the semiconductor wafer W by vacuum.

The probe card 14 has the probe needles 14A corresponding in number to the electrode pads of the integrated circuit chip, and is supported by a ring insert 16.

An image sensor comprising a camera, e.g., a CCD, i.e., a first camera 18 is disposed above the probe card 14 at a position from where the chip and the probe needles 14A can be observed. The first camera 18 is used not only for photographing the electrode pads of the chip and confirming the contact state of the probe needles and the electrode pads, but also for outputting the positions and sizes of the formed needle marks of the probe needles, formed by urging the probe needles against the electrode pads, to a decision control processor 26 (to be described later) as image signals.

A camera 20 for confirming the contact state between the electrode pads of the integrated circuit chip and the probe needles is arranged, in addition to the first camera 18, aside a position where they contact each other.

The probe card 14 described above is movable between a position, indicated by a solid line in FIG. 1, for inspecting the electrical characteristics of the integrated circuit chip, and a position, indicated by an alternate long-and-two-short-dashes line, for detecting the positions of the probe needles 14A. A camera for detecting the positions of the needle points of the probe needles 14A, i.e., a second camera 22, is arranged at the read position to oppose the lower surface of the probe card 14. The light-receiving portion of the second camera 22 opposes the needle points of the probe card 14. More specifically, the second camera 22 is provided in order to obtain position information, i.e., the first position information, of the probe needles 14A mounted to the probe card 14. Therefore, in the probe card 14 which has been moved to the read position indicated by the alternate long-and-two-short-dashes line in FIG. 1, specific needles, e.g., probe needles 14A located at positions corresponding to pads P1 to P4 in FIG. 2 near the four corners of the chip itself, are selected as specific needles with reference to the matrix points on a monitor 24, and the coordinate positions of these specific needles in the X and Y directions are read. The read information is output to the decision control processor 26 (to be described later), and an appropriate relationship between the probe needles and the pads is set.

The decision control processor 26 has, e.g., a microcomputer constituting a processor as its main portion. A ROM 26A storing a basic program needed for executing a probing process and basic data needed for processing, and a RAM 26B for storing the results of various processing operations are connected to the input of the decision control processor 26. The first and second cameras 18 and 22, a setting unit 28 having an operation panel, and a potentiometer 30 provided to a driving unit 32 of the wafer chuck 12 are also connected to the input of the decision control processor 26 through interfaces (not shown).

The monitor 24, the driving unit 32 of the wafer chuck 12, and a probe card exchange driving unit 34 are connected to the output of the decision control processor 26.

The setting unit 28 provided on the operation panel is used for inputting data required for selecting, by a manual operation, the type of the chip to be subjected to probing, and is connected to the input of an interface (not shown). Information concerning the pad positions of the chip selected by the setting unit 28 is selected from information registered in advance in the ROM 26A. Such position information concerning the pads of the chip is sometimes selected by a central administrative controller (not shown) which manages the entire manufacturing process.

The driving unit 32 of the wafer chuck 12 connected to the output of the decision control processor 26 controls the movement of the wafer chuck 12 in the X, Y, Z, and θ directions. The moving amount and direction are set in accordance with driving signals from the decision control processor 26.

The decision control processor 26 performs a processing operation for matching the positions of the electrode pads on the respective chips of the semiconductor wafer W placed on the wafer chuck 12 and the positions of the probe needles 14A of the probe card 14.

As the alignment procedure, the training steps of positioning the probe needles 14A with respect to the specific pads selected in advance, the setup steps of setting up the probe needles 14A for pads other than the specific pads, and the setup check steps for enabling appropriate alignment of the probe needles and the pads of the chip when all the correspondences between the pads and probe needles are to be continuously inspected through the training and setup steps, are executed.

The setup operation executed in the probing method according to the present invention will be described.

In the probing method of this embodiment, before all the probe needles 14A are set up for all the pads of each integrated circuit chip on the semiconductor wafer, the training steps of initially setting the positional relationship between the specific electrode pads of a chip and the probe needles are set. These training steps are executed in order to search for the positions of the probe needles 14A corresponding to the specific pads located at positions P1 to P4 shown in FIG. 2 and to match the positional relationship between them. More specifically, in the training steps, search for the positions of the specific ones of the probe needles 14A, decision of the actual positional relationship between the position-searched probe needles 14A and the specific pads of the chip, and position correction in accordance with this decision are performed.

The training steps will be described in detail with reference to FIG. 3 and so on.

This training processing is executed immediately after, e.g., the type of the integrated circuit chip is altered or the probe card is exchanged.

In this processing, in step 101, the decision control processor 26 decides whether or not the coordinate position information of specific pads in accordance with the type of the chip are input. As the coordinate position information input at this time, the coordinate position information of pads which are set in design of the integrated circuit chip are used, and is stored in the RAM 26B.

Figure 6:
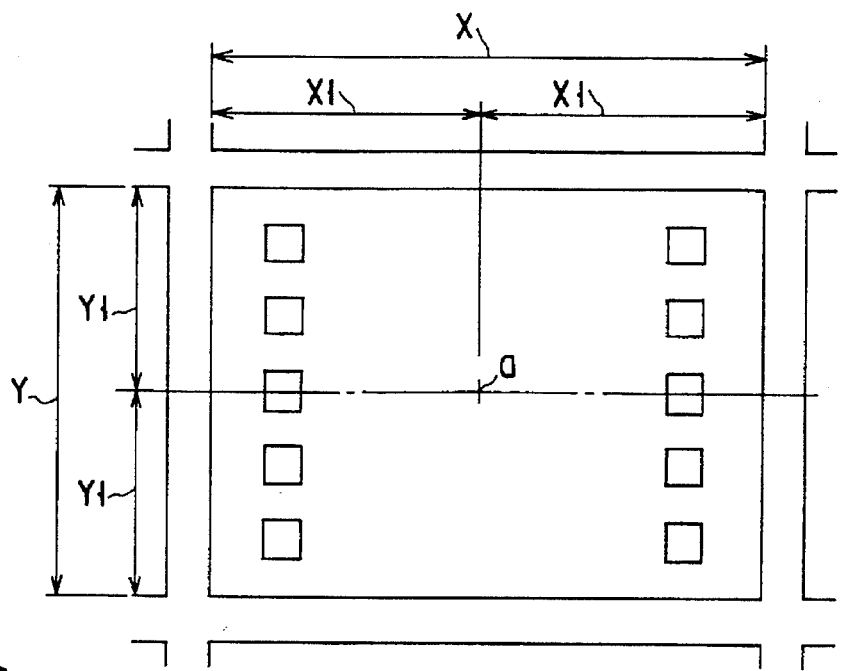
FIG. 6 is a schematic diagram for explaining a method of setting a virtual center in order to obtain a specific pad according to the present invention.

When it is decided that the coordinate position information of the specific pads are not input, coordinate position information are manually registered (step 102). Manual registration is performed in order to obtain the distances from a virtual center a of a chip W to one of a predetermined number of specific pads in the X and Y directions, as shown in FIG. 6. More specifically, the distances in the X and Y directions are measured on the four boundary positions on the edges of a protection film on the surface of the chip, i.e., on the passivation edge, the virtual center a is obtained from these distances, and the coordinate position of the specific pad as a reference in the X and Y directions from the virtual center a is calculated. Separately from this, of the pads of the chip, if the coordinate position of the reference pad, i.e., the pad P1 shown in FIG. 2, is known, the coordinate positions of the remaining pads are calculated by operating the camera in the horizontal and vertical directions on the X-Y plane with respect to the pad P1 as a reference. The position information of the respective pads are registered in the RAM 26B.

As another method of determining the coordinate position of a pad, a method disclosed in U.S. Pat. No. 08/255,903 can be utilized. According to this method, the centroid of the chip is obtained, and the coordinate position of a specific pad is obtained from the centroid. Similarly, the centroid of the probe card is obtained, and the coordinate position of a probe needle can be obtained from the centroid of the probe card.

In the training steps, the probe card 14 is positioned at the read position indicated by the alternate long-and-two-short-dashes line shown in FIG. 1. When the probe card 14 is arranged at the read position, the second camera 22 is positioned in the Z direction as a preparation for matching the positional relationship between the specific pads of the chip and the probe needles (step 103). This positioning is performed by focusing the second camera 22 on the needle point of a probe needle 14A located at, of the specific pads of the chip, a reference pad (e.g., the pad P1 at the upper right corner in FIG. 2) (step 104). This focusing operation is performed by using an auto-focus mechanism having a known structure, and whether or not the auto-focus operation is completed, in other words, whether or not an in-focus state is obtained, is decided (step 105).

If an auto-focus operation cannot be performed, the camera is focused on the needle point of the probe needle 14A corresponding to the reference pad by a manual operation of the operator (step 106). Even when it is determined that auto-focus is completed, visual recognition is preferably made by the operator. Then, an operation error in that the needle point of the probe needle 14A is not in focus but another portion is in focus can be avoided. When a manual focus operation cannot be performed, it is determined that the probe needle is abnormal, and an error display is performed (step 106B). In this case, the probe card may be automatically exchanged.

When the focusing operation is completed, the registration step of storing the coordinate position of the specific probe needle in the X and Y directions in the RAM 26B of the decision control processor 26 is performed (step 107). Then, three-dimensional position information of the reference probe needle of the probe card 14 corresponding to the reference specific pad P1 of the chip W can be obtained.

When the coordinate position of the reference specific probe needle 14A is registered in the RAM 26B, it is decided whether or not the coordinate position information of all the remaining specific probe needles 14A of the probe card 14 corresponding to the specific pads P2 to P4 of the chip other than the reference pad P1 is registered. Then, the registration operation is completed (step 108).

Figure 7:
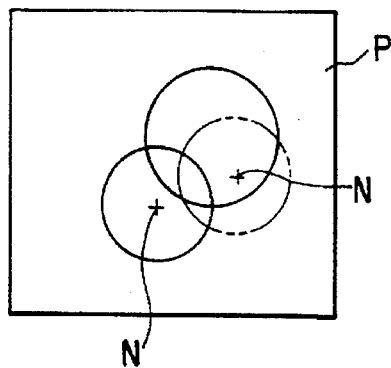
FIG. 7 is a schematic diagram for explaining a needle mark detecting method in the probing method according to the present invention.

When the registration operation is completed, a reference probe needle 14A is selected from the registered probe needles 14A based on the respective position information. Virtual needle mark formation, so-called virtual pin inspection, for the specific pads P1 to P4 of the chip is performed by using this selected probe needle 14A (step 109). In this case, a needle mark is formed by considering over-drive and is expressed as coordinate position information. More specifically, the coordinate position information of the probe needle is overlapped on the coordinate position information of the pad by considering the moving amount caused by over-drive. The needle mark formed by virtual pin inspection is used for sampling or monitoring for deciding whether or not the contact state between the probe needle 14A and the pad is appropriate. Decision using the virtual needle mark formed in step 109 is based on, for example, whether or not the virtual needle mark is completely inside the area of the pad, or the needle mark is on the passivation edge extending outside the periphery of the pad as the protection film of the pad, or the displacement amount of a needle mark N is located within a predetermined range from the central position of a pad P, as shown in FIG. 7, in accordance with its coordinate position (step 110).

Virtual pin inspection described above, and decision concerning the needle mark obtained by virtual pin inspection are executed for all the specific pads of the chip.

As the result of decision of step 110, when it is decided that the specific probe needle 14A does not form a needle mark within the predetermined range of any of the corresponding specific pads P1 to P4, an alarm is produced to inform the operator that the contact state between the probe needles and the pads is abnormal (step 111). The operator takes a countermeasure, e.g., exchange of the probe card, in accordance with this alarm.

In the above description, if the displacement amount falls outside the predetermined range, an alarm is generated to urge the operator to perform, e.g., exchange of the probe card. If the displacement amount falls within the predetermined range, the pad position information may be corrected, a virtual needle mark may be formed again, and whether or not the displacement amount falls within the predetermined range may be checked in step 110. Alternatively, the steps of correcting the pad position information and checking the displacement amount may be performed a predetermined number of times.

In step 110, when it is decided that the positions of the needle marks formed on the specific pads P1 to P4 by virtual contact of the specific probe needle are within an allowable range, whether or not registration of the coordinate position of a probe needle 14A other than the specific probe needles, i.e., of a probe needle other than above specific probe needles corresponding to the pads P1 to P4 is designated, is decided (step 112). If Yes in step 112, the registration step is performed (step 113), and whether or not the registration step is executed for all the designated probe needles is decided (step 114). In this step, advancing from alignment of the probe needle 14A executed before, all the specific probe needles are monitored in a manner close to actual probing.

When data concerning the coordinate positions of all the probe needles are input, virtual needle mark formation by these probe needles 14A is executed (step 115). The formation states of all the virtual needle marks are sampled. Whether or not the virtual needle marks are formed within the predetermined range is decided, i.e., a decision similar to step 110 is executed (step 116).

In step 116, if the displacement amount of a virtual needle mark exceeds a predetermined amount, an alarm process for calling the operator is executed (step 117). In this case, not only the operator may be called, but also automatic probe card exchange may be executed. These processing operations must be included in the program if necessary.

In steps 116 and 117, if the displacement amount falls outside the predetermined range, an alarm is generated to urge the operator to perform, e.g., exchange of the probe card. However, if the displacement amount falls outside the predetermined range, the pad position information may be corrected, a virtual needle mark may be formed again, and whether or not the displacement amount falls within the predetermined range may be checked in step 116. Alternatively, the steps of correcting the pad position information and checking the displacement amount may be performed a predetermined number of times.

In the above decision (step 116), when it is decided that the displacement amounts of the virtual needle marks fall within the predetermined range, of the displacement amounts, the maximum displacement amount, i.e., the worst value indicating the largest displacement amount, is extracted (step 118). Extraction in this case is executed by, e.g., obtaining the X, Y, and θ values of each of the displacement amounts between the respective probe needles and the corresponding pads, and by extracting the maximum X, Y, and θ values.

Subsequently, with reference to the coordinate position of the probe needle obtained in step 118, the first correction step of correcting the positional condition including θ correction is performed (step 119).

Figure 8A:
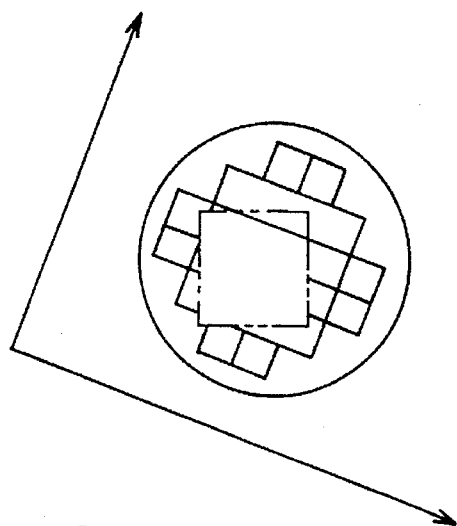
FIGS. 8A to 8C are schematic diagrams for explaining the principle of correction of θ alignment in the probing method according to the present invention.
Figure 8B:
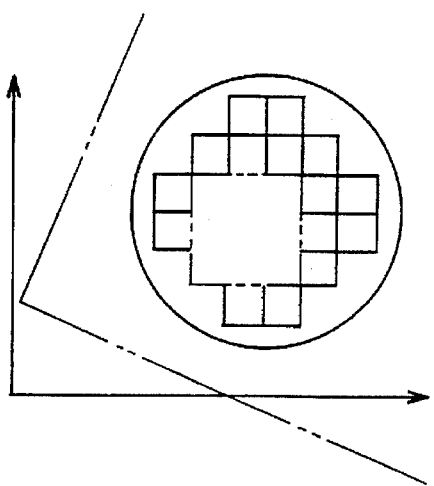
Figure 8C:
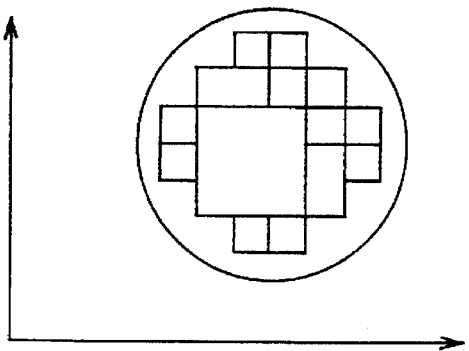

This θ correction is performed by, e.g., aligning the direction of the chip with the direction of the probe card which is immovably provided. Therefore, as shown in FIGS. 8A, 8B, and 8C, the wafer chuck 12 is not only rotated merely in the θ direction, but is also driven in the X and Y directions simultaneously while calculating a correction angle with respect to the displacement angle, thereby correcting the displacement angle in a stepwise manner.

In this manner, when the stepwise feed operation of the wafer chuck 12 is performed, the direction of the chip is gradually aligned with the direction of the probe card, and the X and Y coordinates of the chip are also corrected, so that the probe needle can be accurately moved in the X and Y directions.

By this processing operation, alignment is performed between the respective pads of the chip and the probe needles 14A. Then, a specific probe needle corresponding to one pad of the chip, the specific pad P1 described above in this case, is designated (step 120).

Then, a state wherein all the pads and probe needles correspond to each other is set (step 121). The wafer chuck 12 is moved in the Z direction in the same manner as in an ordinary probing operation, and actual needle mark formation is performed by over-drive (step 122).

Subsequently, whether or not the actual needle mark of each probe needle 14A is located within the predetermined range of the corresponding pad is decided (step 123). If No in step 123, it is decided whether or not this result is obtained after first needle mark formation (step 124). If decision concerning actual needle mark formation is performed for the first time, the positional condition under which the probe needle 14A is actually brought into contact with the corresponding pad is corrected (step 125). In this case, at least one of the coordinates (X, Y, and θ) of the pad is automatically corrected (step 125).

Figure 9A:
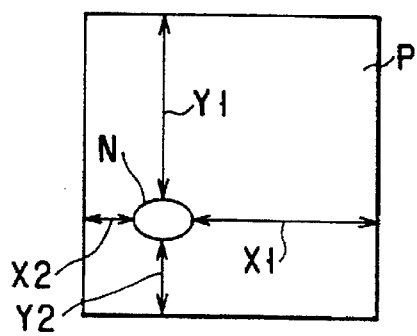
FIGS. 9A and 9B are schematic diagrams for explaining a principle of correction in the X, Y, and θ directions in the probing method according to the present invention.
Figure 9B:
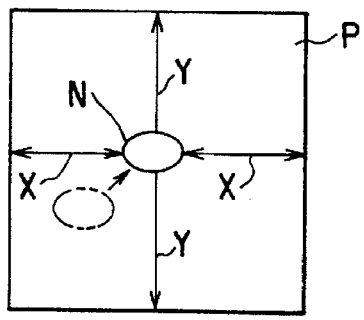

Regarding position correction of the probe needle 14A, for example, as shown in FIGS. 9A and 9B, the position displacement between the virtual center of the pad P and the needle mark N is calculated by image recognition, and the needle mark N is set at a position where the position displacement is minimum, that is, the position of the needle mark N is corrected such that the position displacement with respect to the substantial pad center is the smallest. In other words, the position of the pad is corrected with respect to the immovable probe needle such that the actual needle mark position is displaced to the central position of the pad. As a method of obtaining this virtual center, e.g., the method of least squares is employed.

In the above decision process, if the result that the probe needle 14A is not located within the predetermined range is obtained not for the first time, an alarm operation is performed (step 126). In the result of decision executed in step 123, if the needle mark of the probe needles 14A is within the predetermined range of the pad, the flow advances to an ordinary step of actually bringing the probe needle into contact with the pad (step 127).

In this manner, position displacements between the specific pads including the reference pad (including other pads as well, if necessary) and the corresponding probe needles are obtained, and the X, Y, and θ conditions of the chip are corrected. Thereafter, needle marks are formed by actually bringing the probe needles into contact with the corresponding pads. The actual position displacement is obtained from the formed needle marks, and correction of X, Y, and θ of the above chip is executed again.

Figure 10:
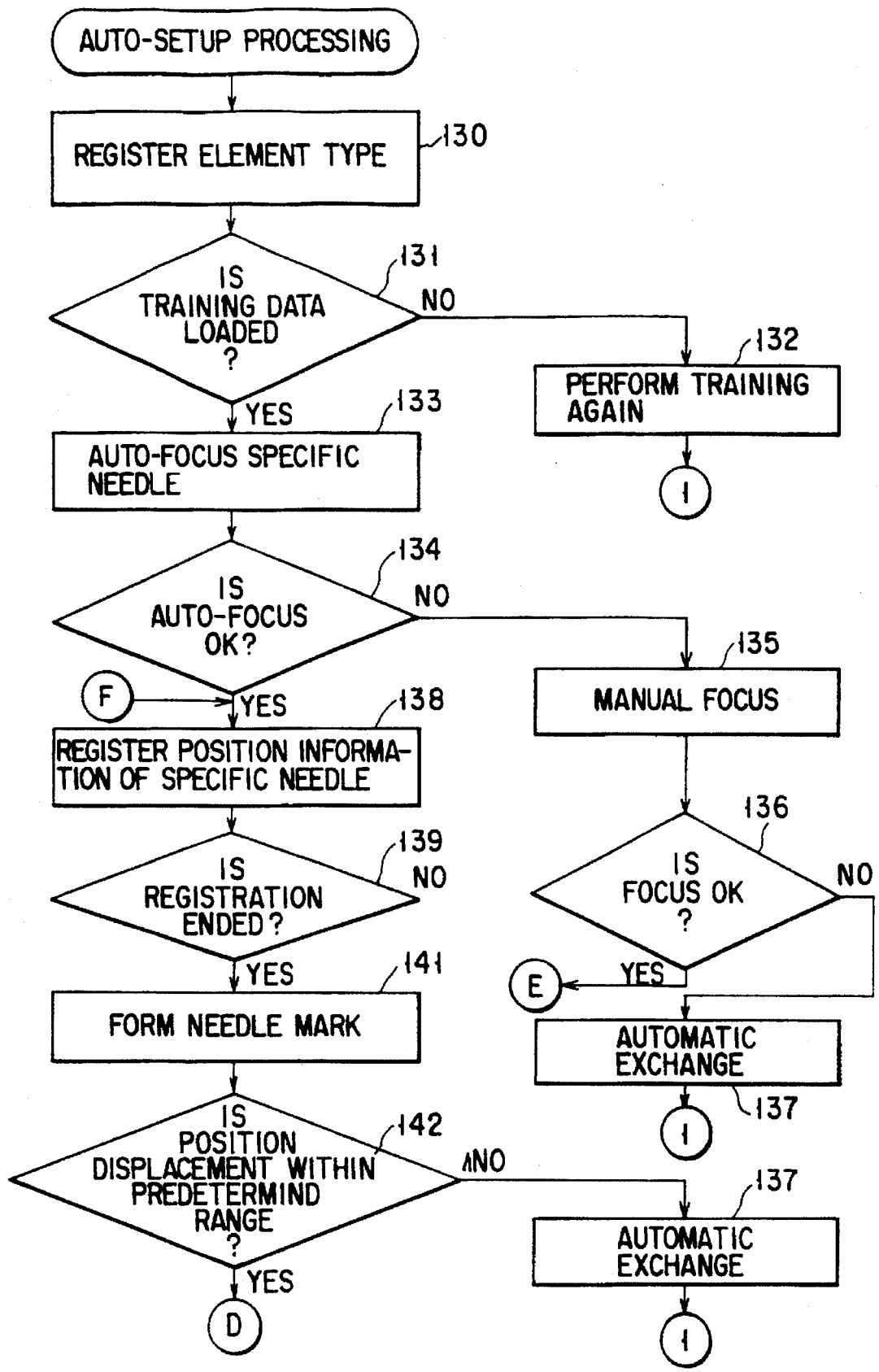
FIG. 10 is a flow chart for explaining a sequence for auto-setup by the probe apparatus shown in FIG. 1.

In chip probing inspection executed after the above training steps are completed, auto-setup processing shown in FIG. 10 and so on is executed. This auto-setup processing is a monitoring operation based on the premise that actual probing is performed by adjusting the positions of the probe needle and the pad monitored in advance. In the auto-setup processing, the contact states of the probe needles corresponding to all the pads are inspected, in the same manner as in actual probing.

Auto-setup processing is executed when, e.g., the power is turned on or the probe card is exchanged. More specifically, in auto-setup processing, first, the type of the integrated circuit chip is input (step 130).

Whether or not training data corresponding to the input chip type is to be loaded is decided (step 131). For example, if the operator wishes to perform training again although the corresponding data exists, the flow advances to the training processing described above (step 132).

When the corresponding data is to be used unchanged, this data is loaded, and auto-focus of a specific probe needle, i.e., a specific probe needle corresponding to the pad P1 in FIG. 2 in this embodiment, is executed (step 133). Whether or not auto-focus was attained is discriminated (step 134). If auto-focus is impossible, a focusing operation in accordance with a manual operation is executed (step 135). Whether or not a focusing operation was successfully attained by the manual operation is determined (step 136). If the focusing operation cannot be performed even by the manual operation, it is determined that the probe needle is abnormal, and the probe card is automatically exchanged (step 137).

When this automatic probe card exchange is performed, the decision control processor 26 outputs an operation instruction to the probe card exchange driving unit 34, so that a new probe card is set at the read position. In this case, the probe card exchange driving unit 34 extracts the probe card set in the ring insert 16 by using a handler (not shown), and mounts a new probe card, taken out from the storage section, on the ring insert 16.

When the probe needle is auto-focused, the position information of the specific probe needle is registered as the coordinate position in the X and Y directions, in the same manner as in the training steps, and a registration step is performed (step 138). Then, the three-dimensional position information of the probe needles corresponding to the reference specific pads P1 to P4 of the circuit chip can be obtained.

Whether or not the coordinate position information is registered in step 138 is decided (step 139). If No in step 139, it is determined that the probe needle is abnormal, and automatic probe card exchange is executed (step 140).

When this registration operation is completed, the probe needles 14A and the specific pads (P1 to P4) of the integrated circuit chip are virtually brought into contact with each other by using the coordinate information, thereby forming virtual needle marks (step 141). More specifically, the coordinate position information of the probe needles are overlapped on the coordinate position information of the specific pads.

Whether or not certain criteria are satisfied in the above step is decided: it is decided as to whether or not the needle mark is within the predetermined range, the position displacement amount falls within an appropriate range, and the like (step 142). In step 139, if the registration step cannot be performed, it is determined that the probe needle is abnormal, and automatic probe card exchange is executed (step 140).

Figure 11:
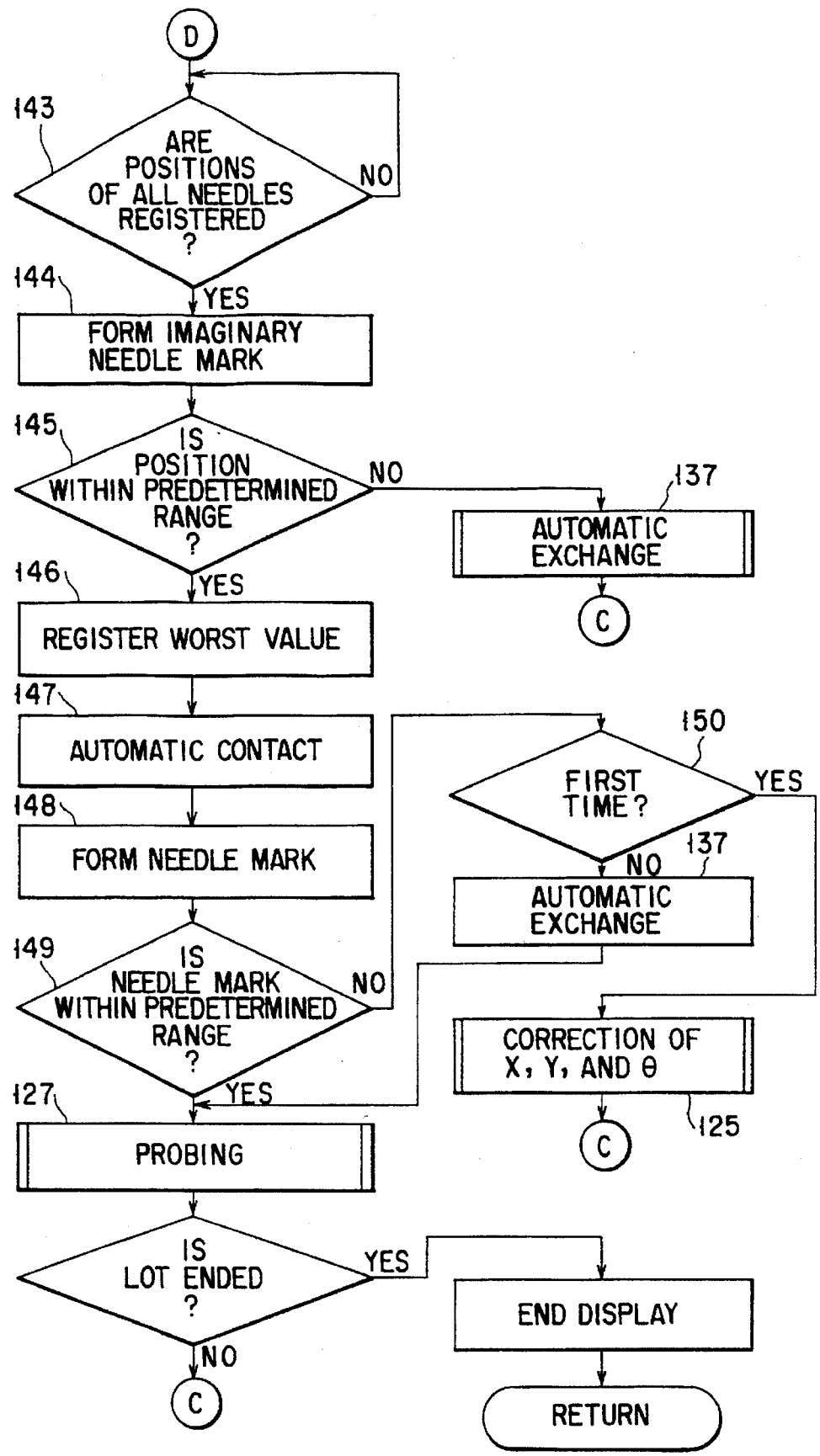
FIG. 11 is a flow chart for explaining another sequence for auto-setup by the probe apparatus shown in FIG. 1.

As shown in FIG. 11, it is decided whether or not position information of the remaining probe needles other than the specific probe needle 14A registered in step 138 are registered (step 143). If registration is completed (Yes in step 143), all the registered pads and probe needles are brought into virtual contact with each other based on the coordinate position information, thereby forming virtual needle marks (step 144). Whether or not each virtually obtained needle mark is within a predetermined range is decided based on whether or not its position displacement amount (the difference between the coordinate position of the pad area and the coordinate position of the needle mark) falls within the appropriate range (step 145).

Of the virtually formed needle marks, a needle mark having the largest position displacement, i.e., a needle mark with which the difference between the central position coordinate of the pad and the needle mark position coordinate is the largest is automatically extracted (step 146), and this probe needle is automatically brought into contact with the corresponding pad (step 147). In this case, contact is performed by over-driving the probe needle in the same manner as in ordinary contact, thereby forming a needle mark (step 148).

Whether or not the actual needle mark is formed at a predetermined position, or whether or not the position displacement amount falls within a predetermined range is decided (step 149). Based on the result of this decision, whether or not this needle mark formation is performed for the first time is determined (step 150). Regarding a processing operation after this, in the training processing, the processing operations shown in steps 123 to 125 are executed.

In the above embodiment, a case wherein the probe needle is abnormal is automatically determined, and the probe card can be automatically exchanged in accordance with this determination result. Thus, probing processing can be automated.

In the probe apparatus according to this embodiment, since correction of θ alignment is performed by moving the chip with respect to the stationary probe card, the sequence of alignment correction can be simplified. More specifically, the structure and operation become easy when compared to a case wherein both adjustment of the moving amount of the card probe and adjustment of the moving amount of the chip are performed.

According to the above embodiment of the present invention, since position displacement information can be obtained from the virtual contact state of the pads and probe needles, not only the actual contact state of the pads and probe needles can be virtually monitored in advance, but also this contact state can be corrected to an optimum state based on the result of the actual contact state. Therefore, the actual contact state of the pads and probe needles is prevented from causing a so-called contact failure.

The actual contact state can be set based on the correction result of the virtually determined contact state of the pads and probe needles, and the contact state can be corrected to an appropriate state based on the result of this contact.

The virtual center of the pad can be automatically calculated, and the formation state of the needle mark can be decided based on the virtual center, so that the operation required for correction can be simplified.

Automatic probe card exchange can be always performed to optimize the contact condition in accordance with the contact condition of the probe card incorporating probe needles to be brought into contact with the pads. Thus, the electrical characteristics of the element can be inspected always under an optimum condition.

Even if the probe card is fixed, the contact positions of the pads with the respective probe needles of this probe card can be optimized.

The position of the needle mark can be displaced to the substantial central position of the pad, and the contact position of the pad with the corresponding probe needle can be optimized.

Since position displacement information can be obtained from the virtual contact state of the pads and probe needles, not only the actual contact state of the pads and probe needles can be virtually monitored in advance, but also this contact state can be corrected to an optimum contact state based on the result obtained from this actual contact state. Therefore, an apparatus capable of preventing the actual contact state of the pads and probe needles from causing a so-called contact failure can be obtained.

An embodiment of an auto-setup type probe inspecting apparatus used in the probe apparatus described above will be described.

A probe apparatus 10 shown in FIG. 12 has an arrangement almost the same as that of the probe apparatus shown in FIG. 1, and thus the same portions are denoted by the same reference numerals and a description thereof will be omitted.

Referring to FIG. 12, an image sensor 18 has a function of recognizing the position information of the electrode pads of an integrated circuit chip and a function of confirming the contact state between probe needles 14A and the electrode pads. Any means can be provided as the image sensor 18 at any position as far as it has these functions.

More specifically, needle marks are formed by bringing the probe needles 14A into contact with the electrode pad arrays of each chip formed on a semiconductor wafer and over-driving the probe needles 14A, thereby executing inspection of the chip by pressure contact. The image sensor 18 detects the positions and sizes of the thus-formed needle marks within the corresponding electrode pads, and outputs the needle mark information to a decision processing unit 120.

The decision processing unit 120 has, as shown in FIG. 13, a calculator 122 for receiving an output from the image sensor 18, an interpolating circuit 124, an area comparator 126, and a decision circuit 128. The decision circuit 128 is connected to a controller 130 for performing sequence control of the inspecting steps. The controller 130 is connected to a memory 132 for storing the position, size, and the like of the needle mark, and a display 134 for displaying the stored content as required. A member for performing a processing operation necessary in the inspecting steps, i.e., an operation for bringing the probe needles into contact with the corresponding electrode pads, e.g., a member for vertically moving a wafer chuck 12, and a member for detecting the elevated position of the wafer chuck 12 are connected to the input and output, respectively, of the controller 130.

The calculator 122 provided to the decision processing unit 120 has a function of calculating the area and area centroid of the needle mark located on each electrode pad from an image signal output from the image sensor 18. The interpolating circuit 124 has a function of obtaining the area and area centroid in the calculator 122 by interpolating, when the needle mark formed on the electrode pad is partly lost as an output of the image sensor 18, this lost part in accordance with, e.g., the pattern recognition technique. The area comparator 126 has a function of storing in advance the position information of the area and area centroid of the needle mark formed on the electrode pad in a normal state, and comparing the stored information with the actual area and area centroid of the needle mark obtained after inspection. The decision circuit 128 has a function of deciding the formation state of the needle mark of the chip which has been actually subjected to inspection, in other words, deciding whether the contact state between the probe needle and the electrode pad is good or bad.

The memory 132 connected to the controller 130 stores the position and area of the needle mark obtained when normal needle mark formation is performed, and also the position and area of the needle mark output to the controller 130 through the decision circuit 128. The position and area of the needle mark output from the controller 130 through the decision circuit 128 are temporarily stored in the memory 132 as the result of the previous inspection when needle mark inspection is performed a plurality of number of times.

In this embodiment, only a needle mark formed on the material of the electrode pad, e.g., aluminum, is recognized by the image sensor 18. Accordingly, color recognition cannot be performed. Therefore, the image sensor 18 performs recognition by outputting a pixel signal based on the difference in luminance or density between a recessed portion formed in the needle mark portion of the electrode pad and the surrounding flat portion.

An example of a needle mark formed on the electrode includes a needle mark having one of subsequent formation states. A normal needle mark will be described first. In this case, the outline of the needle mark is entirely located within the electrode pad, and the area of the needle mark exceeds a predetermined value. In contrast to this formation state, the following cases are possible:

(1) Part of a needle mark N is included in a passivation edge E located around an electrode pad (FIG. 14).

(2) Needle marks N partly overlap each other (FIG. 15).

(3) The needle mark N is partly lost (FIG. 16).

(4) The needle mark N remains only partly (FIG. 17).

In order to detect the formation state of the needle mark N in these states and to decide whether the contact state between the probe needle and the electrode pad P is good or bad, the following methods are employed.

In case (1), the area of the needle mark N located in the electrode pad P is obtained, and the centroid position of this area is obtained. This processing operation is performed by the calculator 122 by calculating a pixel signal sent from the image sensor 18. The contact state between the probe needles and the electrode pads is decided based on the calculated area and centroid position of the area in the manner described above. When the contact state is normal, the calculated area exceeds a predetermined value, and the area centroid is included in a predetermined range. Thus, even if one of the above conditions is not satisfied, it can be determined that a contact failure has occurred.

In case (2), it must be noted that the respective overlapping portions partly constitute the area of the previously formed needle mark and the area of the needle mark formed the last time. The previously formed needle mark including one overlapping portion is subtracted from the sum of the area of the previously formed needle mark N and the area of the needle mark N formed the last time, thereby obtaining the area of the needle mark formed the last time including the remaining overlapping portion. Referring to FIG. 15, assume that an area S1 of the previously formed needle mark corresponds to the sum of a non-overlapping portion A and an overlapping area C, and an area S2 of the needle mark formed the last time corresponds to the sum of a non-overlapping portion B and an overlapping portion C. Thus, referring to FIG. 15, the area (S2) of the needle mark formed the last time takes the value of the following equation:

$$(S2)=(A+C+B+C)-(A+C)$$

The contact state is decided from these area and area centroid in accordance with the above criteria for deciding a contact failure.

In case (3), as described above, the shape of the needle mark on the electrode is regarded as being similar to an ellipse due to slipping of the probe needle and the electrode caused by over-drive in a contact transient phenomenon. The lost part is interpolated by a pixel signal output from the image sensor in accordance with, e.g., the method of interpolation of first degree or the method of interpolation of second degree, which is used normally, or the Newton's method of successive approximation, thereby calculating an approximate needle mark area as an ellipse. The approximate area and area centroid position are compared with the area and area centroid position obtained when the contact state is normal. In case (4), a premise similar to that of case (3) is set. Namely, assume that the needle mark is similar to an ellipse. With reference to arbitrary coordinate positions (positions Q1 to Q4 in FIG. 17) of the outline of part of the ellipse, the area and area centroid position of an ellipse including this part as its constituent portion are calculated. The obtained area and area centroid position are compared with the area and area centroid position obtained when the contact state is normal, in the same manner as in case (3).

In cases (3) and (4), the premise includes not only that the needle mark is formed within the electrode pad, but also that the needle mark is partly located outside the electrode pad, i.e., at the so-called passivation edge.

In decision of the area of the needle mark, an area obtained when the contact state is recognized as a normal contact is set as a threshold value. Needle mark detection is performed during execution of the inspection steps in order to decide when to exchange the probe needle or whether the contact state is good or not from the state of the probe card.

Figure 18:
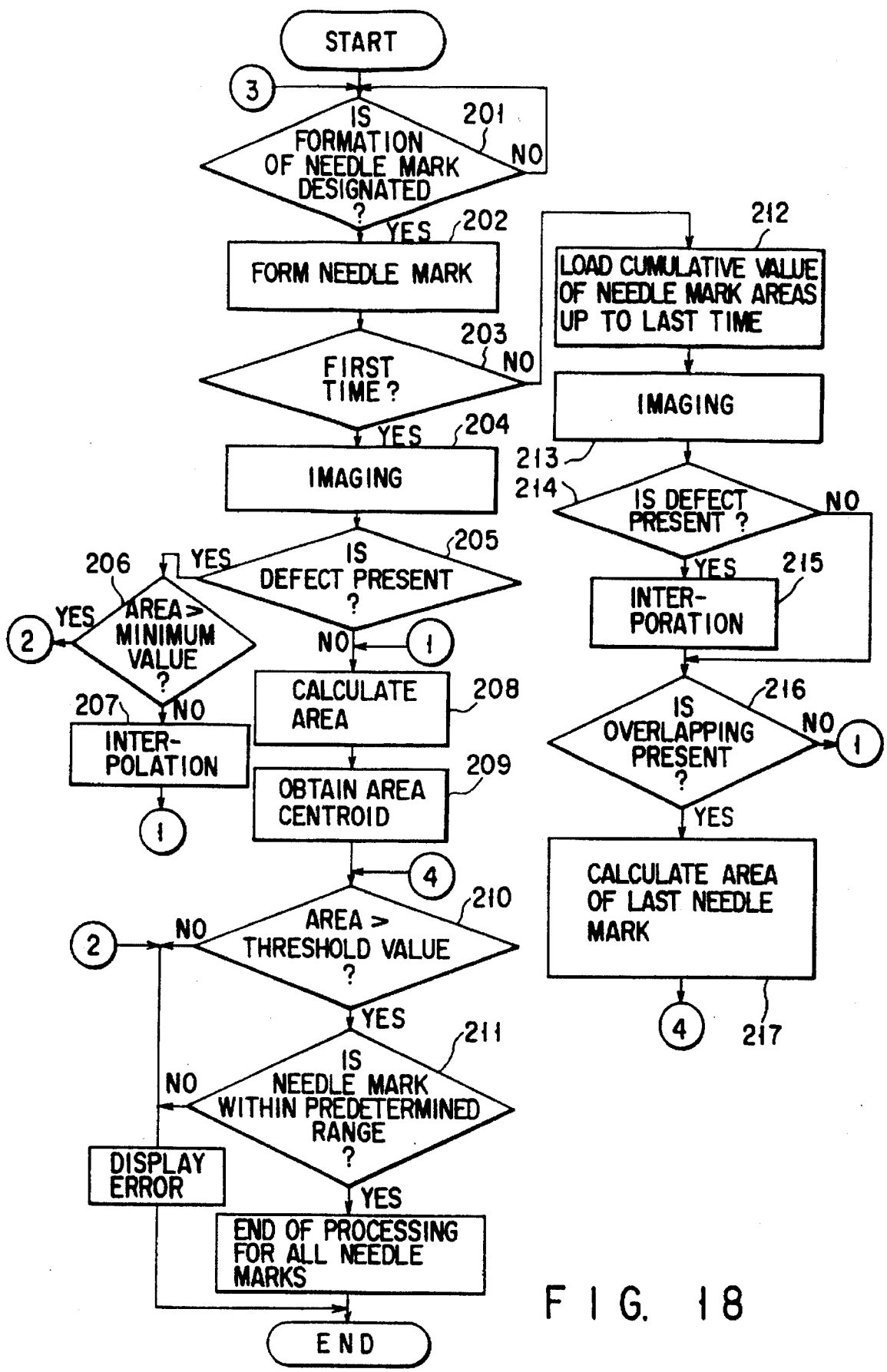
FIG. 18 is a flow chart for explaining the operation of the apparatus shown in FIG. 12.

The operation of the decision processing unit 120 of the probe apparatus of this embodiment will be described with reference to the flow chart of FIG. 18.

When inspecting steps for an integrated circuit chip formed on a semiconductor wafer or a selected chip are to be executed, whether or not inspection of a needle mark is designated is decided (step 201). If Yes in step 201, the semiconductor wafer placed on the wafer chuck is driven in the Z-axis direction with respect to the probe needles, i.e., is driven upward. The respective probe needles are brought into contact with the corresponding electrode pads. Over-drive of a predetermined amount is executed, and inspection is executed. When over-drive is executed, needle marks are formed on the electrode pads (step 202).

After needle mark formation, whether or not this needle mark formation is performed for the first time is decided (step 203). If Yes in step 203, the electrode pads of the integrated chip, where the needle marks are formed, of the semiconductor wafer placed on the wafer chuck are image-picked up by the image sensor 18 (step 204).

Whether or not the needle mark has a lost part is decided based on a pixel signal from the image sensor 18 (step 205). If Yes in step 205, the area of the needle mark excluding the lost part is calculated, and whether or not this area exceeds a minimum area that can be subjected to interpolation is decided (step 206). Regarding presence/absence of a lost part, for example, usually, pixel signals are output in accordance with the outlines of continuous needle marks. In contrast to this, when continuous pixel signals are not output, this needle mark is decided to have a lost part. The larger the lost part, the larger the displacement between the actual needle mark area and the area for interpolation. This area decision is performed in order to extract only a needle mark having a minimum area necessary for interpolation.

In step 206, if the calculated area is larger than the minimum value, interpolation is performed (step 207). The area and area centroid of the interpolated needle mark are calculated (steps 208 and 209). Also, when it is determined in step 205 that the needle mark does not have a lost part, the area and area centroid position of this needle mark are calculated (steps 208 and 209).

The calculated area of the needle mark is compared by the area comparator 126 of the decision processing unit 120 with a threshold value corresponding to the area obtained when it can be determined that a normal contact operation is performed (step 210). Since the threshold value of this case is used for comparison with the area of the needle mark on the electrode pad, the needle mark may partly overlap a portion other than the electrode, i.e., the passivation edge. The reason why the needle mark may partly overlap the passivation edge is as follows. Even if the needle mark partly overlaps the passivation edge, sometimes the area of the portion of the needle mark overlapping the passivation edge is minimum and most of the needle mark is substantially included within the electrode.

In addition to comparison of the area of the needle mark, whether or not the position of the area centroid of the needle mark is within a predetermined range is decided (step 211). The predetermined range used for decision of the area centroid position is a range with which it can be determined that a normal contact operation can be performed even if the needle mark is displaced from the center of the area of the electrode by a certain degree.

Only when the area of the needle mark formed on the electrode exceeds the threshold value in step 210 and the area centroid position is within the predetermined range in step 211, is it decided that the probe needles are in a good contact state with the electrodes.

If it is decided in step 203 that the chip subjected to the inspecting steps is different from the one subjected to the inspecting steps for the first time, the area of the previously formed needle mark concerning this chip and the cumulative value of the area centroids are read from the memory 132 (step 212).

In this manner, the inspecting steps are executed not for the first time when, e.g., an integrated circuit chip, the wiring portion of which is repaired, is subjected to inspection. In this case, since the first needle mark is already formed on the chip, the area and area centroid of the first needle mark must be stored in the memory 132 in advance. The needle mark is image-picked up again (step 213), and the absence/presence of a lost part is decided based on a pixel signal from the image sensor 18 (step 214). Decision of the presence/absence of a lost part in this case is executed with the same criteria as that of step 205. If the needle mark has a lost part (Yes), interpolation of the lost part is executed (step 215). If the needle mark does not have a lost part, or is subjected to interpolation, whether or not this needle mark overlaps the previous needle mark is decided (step 216).

Decision of overlapping is performed by determining, using a pixel signal from the image sensor 18, whether or not this needle mark partly has a portion of the same coordinate position as that of the previous needle mark. If it is determined in step 216 that this needle mark does not have an overlapping portion, the area and area centroid position of the needle mark formed the last time are calculated, and the flow advances to step 210.

If it is determined in step 216 that this needle mark has an overlapping portion, the area of the needle mark formed the last time is calculated (step 217). In this case, since the overlapping portion found this time is in common with the previous overlapping portion, the area of the previous needle mark is subtracted from the sum of the area of the needle mark found this time and the area of the previously formed needle mark, thereby obtaining the area of the needle mark formed this time, as has been described above with reference to FIG. 15 (step 217).

As described above, according to this embodiment, needle mark formation is performed a plurality of number of times also when the chip is repaired and when the probe needle is exchanged.

As described above, according to the present invention, whether the contact state is good or bad is decided based on at least one of the position and area of the needle mark formed on the electrode pad. Thus, when the needle mark is not located on the electrode pad, or when the needle mark does not have a predetermined area even if it is located on the electrode pad, a contact failure can be decided as the electrode pads and probe needles are not in sufficient direct contact with each other.

When the needle mark is shifted from the electrode pad, it can be detected by obtaining the area centroid of the needle mark from the position information of the needle mark. Then, even if the needle mark is partly located on the electrode pad, if the area centroid of this needle mark is not within the predetermined range of the electrode pad, it can be decided that a contact state which prevents an increase in the contact resistance is not set.

The contact state can be decided when it is detected that the outline of a needle mark is located within the electrode pad by using the outline of this needle mark as a reference. Thus, the contact state can be decided in accordance with the formation state of the outline.

When the area of the needle mark is equal to or less than the predetermined value, it can be decided that the oxide film is not completely removed by the probe needles. Thus, the contact state can be decided in accordance with the remaining amount of the oxide film or the contact pressure.

When the needle mark formed on the electrode pad is not elliptic as described above but has a lost part, the area of the needle mark can be virtually extracted from the remaining needle mark, thereby deciding the contact state.

When the probe needles and the electrode pads are brought into contact with each other a plurality of number of times, the contact state can be decided. Especially, even when the needle marks are formed apart from the electrode pads, the above-described decision can be made for the last needle mark.

When the sum of the areas of the overlapping and non-overlapping portions of the previous needle mark is subtracted from the sum of the area of the previously formed needle mark and the area of the needle mark formed the last time, the area of the last needle mark including the area of the remaining overlapping portion can be obtained. Thus, the area of the needle mark formed the last time can be accurately calculated even if the needle marks overlap each other by subtracting the area of one needle mark from the sum of the areas of the overlapping needle marks.

In this manner, according to the present invention, in the inspecting steps of an integrated circuit chip of a semiconductor wafer, not only the formation state of the needle mark, which is formed such that its color can hardly be discriminated from the color of the material of the chip itself, can be reliably recognized, but also the formation state of the needle mark is decided, so that whether the contact state between the probe needle and the pad is good or bad can be determined almost automatically. Thus, precision concerning determination of the contact state is not degraded.

An embodiment of an auto-setup type probe inspecting method will be described. The arrangement of an auto-setup type probe apparatus used in this method will be described first. This probe apparatus is a wafer prober which inspects the electrical characteristics of, e.g., a large number of integrated circuit chips formed on a semiconductor wafer as an inspection target.

Figure 19:
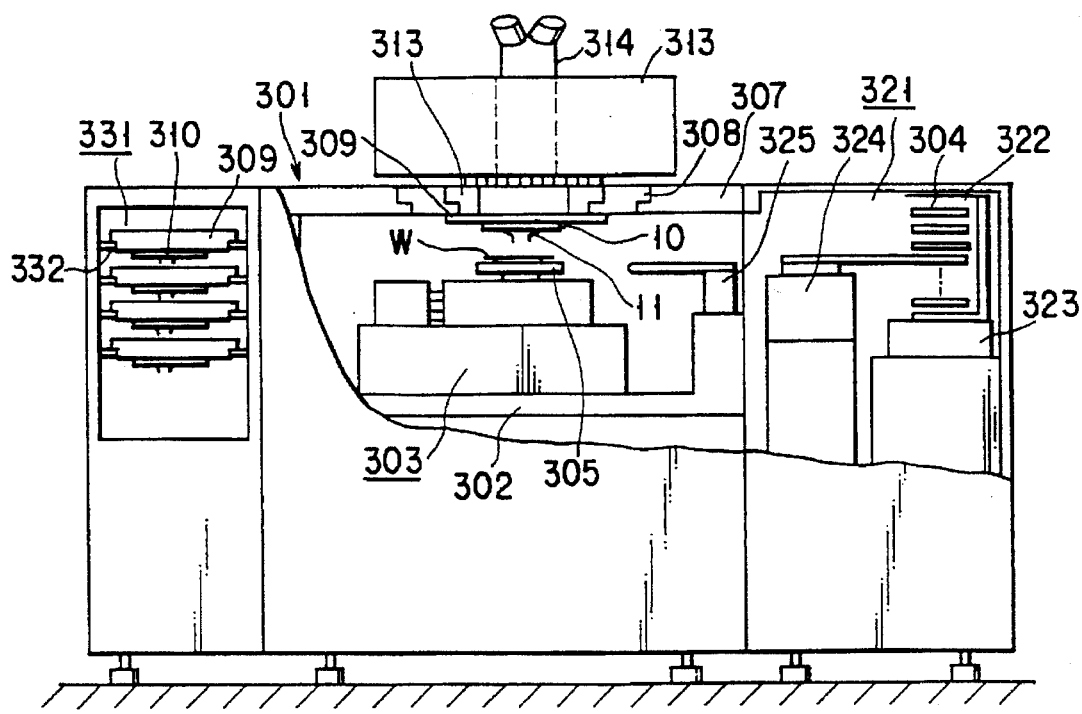
FIG. 19 is a partially cutaway front view of a probe apparatus used in an auto-setup type probe inspecting method according to an embodiment of the present invention.

More specifically, as shown in FIG. 19, a main inspection stage 303 is provided at substantially the center of a probing main machine 301, constituting a box-type body as a whole, through a table 302. The inspection stage 303 has a wafer chuck 305, that places and vacuum-chucks a semiconductor wafer (to be merely abbreviated as a wafer hereinafter) W thereon, to be movable in the X, Y, Z, and θ directions, as will be described later.

An insert ring 308 is positioned and fitted in the central opening of a head plate 307 horizontally fixed in the upper portion of the main machine 301. A probe card 310 is detachably mounted to the insert ring 308 through a card holder 309. The probe card 310 is obtained by mounting a large number of probe needles 311 on a printed circuit board to correspond to the electrode pads of the chip on the wafer W.

A test head 313 to be electrically connected to the respective probe needles 311 is loaded and supported on the upper side of the probe card 310 through a contact ring 312. While the probe needles 311 are in contact with the electrode pads of the chip on the wafer W, the test head 313 outputs a predetermined electric signal to the chip through the probe needles 311 and receives a signal returned from the chip, thereby performing measurement and inspection (quality check of a product) of the electrical characteristics of the chip.

For the purpose of set-up adjustment and maintenance of this apparatus, a microscope (or a television camera) 314 is provided to allow visual observation of the wafer W on the wafer chuck 305, the needle points of the probe needles 311 in contact with the wafer W, and the like, from above the center of the test head 313 through the central opening of the probe card 310.

An auto-loader 321 of the inspection target is set on the right side of the main machine 301. A cassette chuck 323, in which a wafer cassette 322 housing 1 lot of wafers W (e.g., 25 wafers) can be exchangeably set by insertion, is provided to the auto-loader 321 such that it can be vertically driven. An auto-loader stage 324 for automatically extracting the wafers W in the wafer cassette 322 one by one is disposed adjacent to the cassette chuck 323. A wafer W unloaded by the auto-loader stage 324 is placed on a preliminary alignment stage (not shown), and preliminary alignment with reference to the orientation flat or the like of the wafer W is automatically performed on the preliminary alignment stage.

A wafer handling arm 325 is provided as a member for transferring the preliminarily aligned wafer W onto the upper surface of the wafer chuck 305. The auto-loader stage 324 and the wafer handling arm 325 also automatically pick up an inspected wafer W from the upper surface of the wafer chuck 305 and return it to the wafer cassette 322.

Figure 20:
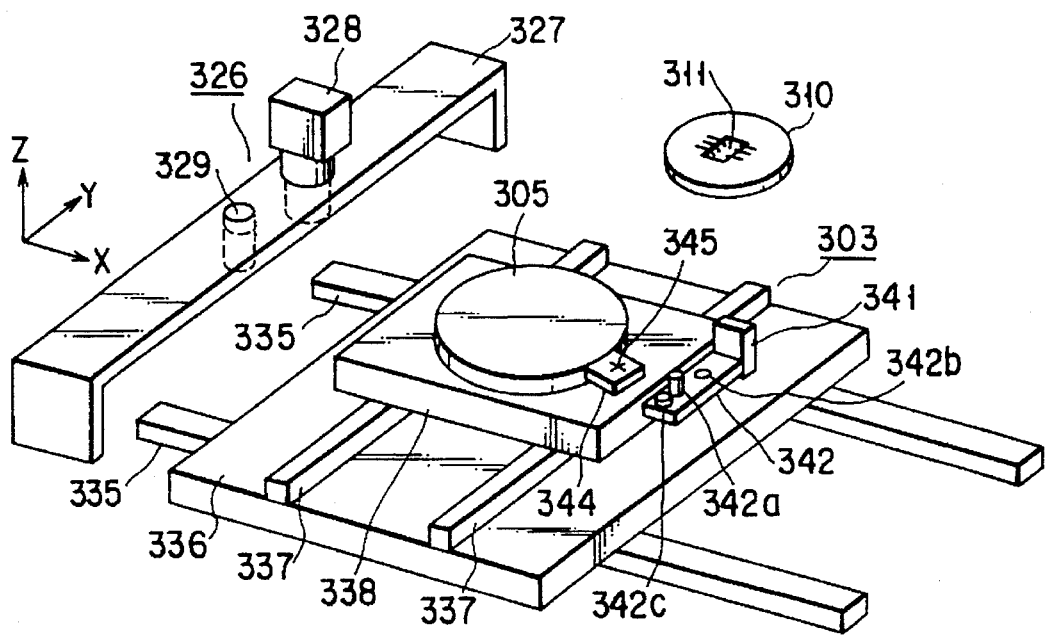
FIG. 20 is a perspective view of the inspection stage and the alignment unit of the probe apparatus shown in FIG. 19.
Figure 21:
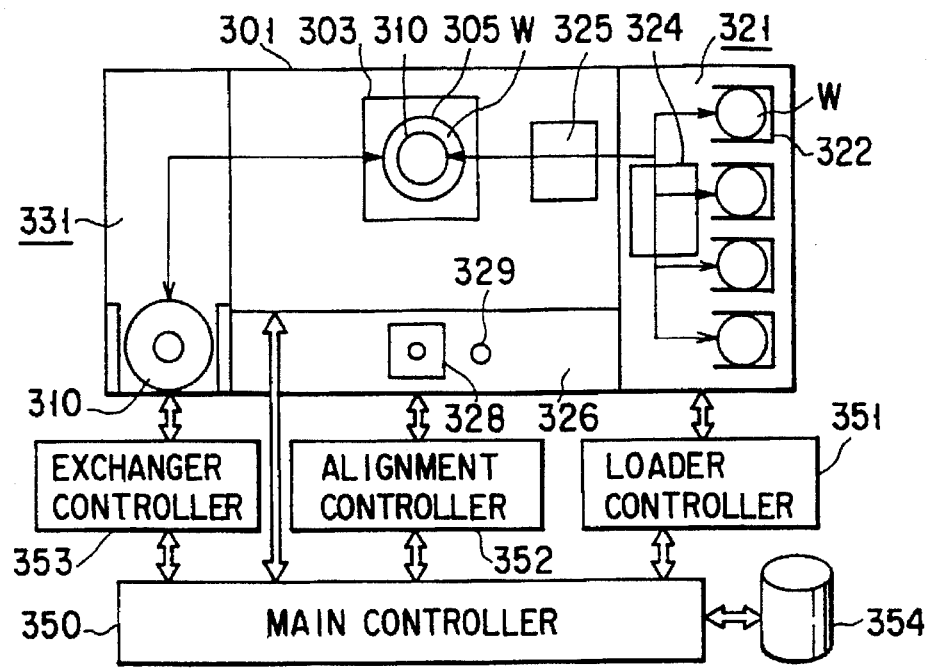
FIG. 21 is a block diagram showing the controllers of the respective mechanism units of the probe apparatus shown in FIG. 19.

As shown in FIGS. 20 and 21, an alignment unit 326 is located in front of the center in the main machine 301. In the alignment unit 326, an optical unit used for alignment and needle mark position detection, e.g., a CCD camera 328 as an image confirmation unit, is arranged in a bridge 327 fixed on the table 302 on the main machine 301, and an electrostatic capacitance sensor 329 for detecting the height (a position in the Z direction) of the surface of a wafer W on the wafer chuck 305 is arranged adjacent to the CCD camera 328. The wafer chuck 305 can move to under the CCD camera 328 and the electrostatic capacitance sensor 329 as it has the wafer W placed thereon.

A probe card exchanger 331 is set on the left side of the main machine 301. Card storage shelves 332 are formed in the probe card exchanger 331. A plurality of probe cards 310 (described above) provided with the card holders 309 are removably stored in the card storage shelves 332. Since the probe cards 310 are expendable supplies and must therefore be exchanged after being used for several days, the probe cards 310 of the same type are stored in the card storage shelves 332 and are used in turn. When the inspection is performed for a large number of different types of parts with small lots, a plurality of probe cards 310 matching this inspection target are stored and used by exchange.

The probe card exchanger 331 performs a card exchange operation of extracting a target probe card 310 from a card storage shelf 332, mounting and setting it on the insert ring 308 at the center of the head plate 307 of the main machine 301, and accepting a used probe card 310 from the insert ring 308, automatically through a unit (not shown) similar to the wafer handling arm 325. The automatic probe card exchange technique for this may be similar to those described in, e.g., Jpn. Pat. Appln. KOKAI Publication Nos. 62-169341 and 62-263647.

As shown in FIG. 20, the main inspection stage 303 has an X table 336, which is movable along two rails 335 extending in the X direction (forward-to-backward direction) indicated on a horizontal plane, and a Y table 338, which is movable along two rails 337 extending in the Y direction (right-to-left direction) on the X table 336. The X and Y tables 336 and 338 are controlled by a conventional X-Y driving mechanism including, e.g., a pulse motor. On the Y table 338, the wafer chuck 305 is controlled by a conventional elevating mechanism and rotating mechanism to be movable in the Z direction (vertical direction) through a vertical axis and rotatable in the e direction about the vertical axis as the center.

An elevator 341 is mounted to a side surface of the Y table 338 of the main inspection stage 303, and a movable camera 342 is provided to be vertically movable by the elevator 341. The movable camera 342 is constituted by a high-magnification part 342a and a low-magnification part 342b. A light-emitting element 342c comprising, e.g., an LED, is disposed adjacent to the high-magnification part 342a. The needle points of the probe needles 311 are illuminated with light from the light-emitting element 342c, thereby measuring the positions of the needle points with the camera 342.

A transparent small segment 344 is fixed to the outer circumferential surface of the wafer chuck 305 to project horizontally. A conductive transparent thin film, e.g., an ITO (Indium Tin Oxide) thin film or a chrome plating film, is formed on the upper surface of the small segment 344, and a target 345, e.g., a crisscross mark, is formed at the center of the upper surface of the small segment 344. The small segment 344 moves together with the wafer chuck 305. The center of the crisscross mark of the target 345 serves as a reference point for detection by the CCD camera 328 and the movable camera 342. The conductive transparent thin film on the circumferential surface of the target 345 of the small segment 344 enables detection of the position (height) of the wafer chuck 305 in the Z direction by the electrostatic capacitance sensor 329 of the alignment unit 326.

As shown in FIG. 21, the respective functional portions of the probe apparatus are controlled by a main controller 350, e.g., a CPU, in accordance with a predetermined program. More specifically, the main controller 350 performs drive control of the X and Y tables 336 and 338 of the main inspection stage 303, drive control of the wafer chuck 305 in the Z and θ directions, and drive control of the movable camera 342 and its elevator 341. A loader controller 351, an alignment controller 352, and a card exchanger controller 353 are connected to the main controller 350 such that they can exchange data and control information with each other.

The loader controller 351 controls the auto-loader stage 324 of the auto-loader 321, the preliminary alignment stage, and the wafer handling arm 325. The alignment controller 352 controls the CCD camera 328 and the electrostatic capacitance sensor 329 of the alignment unit 326. The card exchanger controller 353 controls the probe card exchanger 331.

In other words, the loader controller 351, the alignment controller 352, and the card exchanger controller 353 control the respective mechanisms.

A file unit (memory) 354 for storing data is connected to the main controller 350. The file unit 354 stores a parameter corresponding to the parts type of the inspection target, reference image pattern data for alignment, correction data, position correction data used for probing, and the like.

Figure 22:
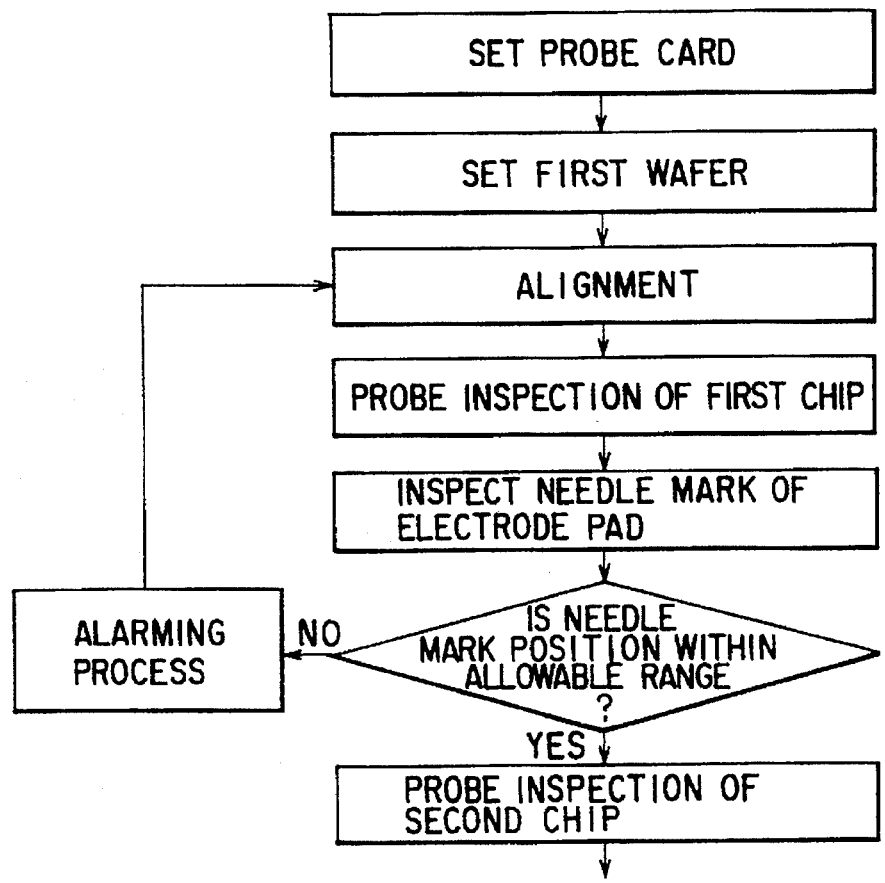
FIG. 22 is a flow chart of the inspecting method of FIG. 19.
Figure 23A:
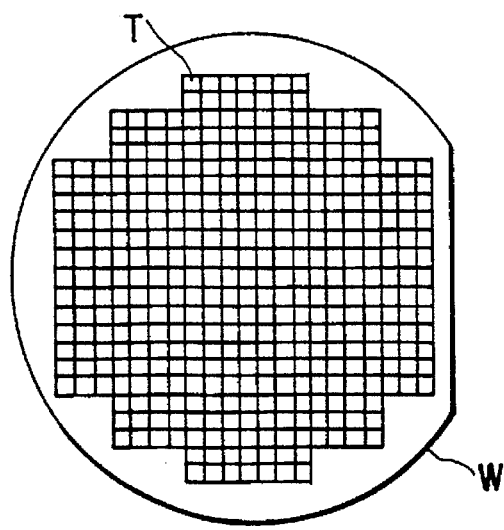
FIGS. 23A and 23B show a plan view of a semiconductor wafer as an inspection target, and an enlarged plan view of one chip of this wafer, respectively.
Figure 23B:
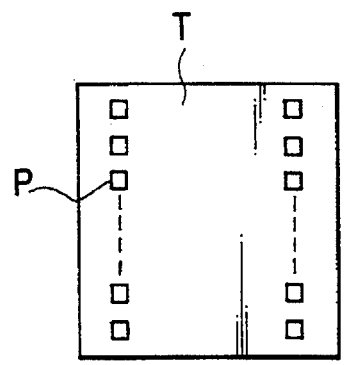

A probe inspecting method of measuring and inspecting the electrical characteristics of an integrated circuit chip of a wafer W by using the auto-setup type probe apparatus having the above arrangement will be described with reference to the flow chart of FIG. 22. On the wafer W as the inspection target, as shown in FIG. 23A, a large number of semiconductor chips T having a predetermined circuit pattern are regularly formed at predetermined gaps. A large number of electrode pads P are provided to each chip T, as shown in the enlarged view of FIG. 23B. As shown in further enlarged views of FIGS. 24A and 24B, each electrode pad P has an exposed electrode A, made of aluminum or the like and covered with an oxide film, on a substrate, and a thin film of a passivation edge (protection film) E with an appropriate width for the purpose of waterproof and insulation is formed around the upper surface of the electrode A.

The probe inspecting method will be described. First, the probe card exchanger 331 is controlled to select a probe card 310 corresponding to the parts type of the wafer W as the inspection target, and to mount and set it on the insert ring 308. The auto-loader 321 is controlled to unload the first wafer W in the wafer cassette 322 with the auto-loader stage 324 and to perform preliminary alignment of this wafer W. The preliminarily aligned wafer W is transferred onto the upper surface of the wafer chuck 305 of the main inspection stage 303 with the wafer handling arm 325, and is held by the wafer chuck 305.

The wafer chuck 305 having the semiconductor wafer W placed thereon in this manner is moved to the alignment unit 326 by the control operation of the inspection stage 303, and is automatically aligned. Several techniques are known as the alignment method in various official gazettes.

One alignment method will be briefly described as an example. First, the X and Y tables 336 and 338 of the inspection stage 303 are moved, and the wafer chuck 305 is moved vertically in the Z direction and rotated in the θ direction, so that the target 345 is positioned near the center of the view field of the high-magnification part 342a of the movable camera 342. Simultaneously, the target 345 is positioned at the focal point of the center of the view field of the CCD camera 328. In this manner, the positions of the wafer chuck 305 in the X, Y, and e directions are recognized by aligning the target 345, the movable camera 342, and the CCD camera 328. In this state, the target 345 or the conductive thin film around the target 345 is moved to immediately under the electrostatic capacitance sensor 329, and its height Z is measured by the electrostatic capacitance sensor 329.

A specific portion of a chip T, to be inspected first, of the wafer W held on the wafer chuck 305 is aligned with the center of the view field of the CCD camera 328, and rotation of the wafer chuck 305 in the θ direction is adjusted in accordance with the arrays of the electrode pads P of the chip T or the scribe lines of the chips on the wafer W. An alignment technique of this type is disclosed in Jpn. Pat. Appln. KOKAI Publication No. 2-224260. In this manner, the respective chips T of the wafer W on the wafer chuck 305 and the positions of the arrays of the electrode pads P of the chips T are pattern recognized. Then, a given chip T is moved to immediately under the electrostatic capacitance sensor 329, and its height Z is measured.

Thereafter, the inspection stage 303 is driven to return the movable camera 342 to immediately under the probe card 310. There, the positions of the needle points of the respective probe needles 311 of the probe card 310 are detected roughly by the low-magnification part 342b of the movable camera 342 and then accurately by the high-magnification part 342a. The positions of the needle points of the respective probe needles 311 in the X, Y, and θ directions relative to the wafer chuck 305 are recognized, and the position (a distance h in the vertical direction to the needle point) of the chip in the Z direction of height is recognized.

Various types of position data obtained in this manner are subjected to calculation, thereby controlling the X and Y tables 336 and 338 of the inspection stage 303 and rotating the wafer chuck 305 in the θ direction. The first chip T of the wafer W is positioned immediately under the probe card 310, and the respective electrode pads P of the chip T and the probe needles 311 are aligned. After this alignment, probe inspection is performed.

In the probe inspection, the wafer chuck 305 is moved upward in the Z direction (vertically upward) based on the position data of the height, in order to bring the probe needles 311 into contact with the corresponding electrode pads P of the first chip T of the aligned wafer W. Then, the wafer chuck 305 is moved upward in the Z direction for a predetermined stroke (over-drive) in order to set the probe needles 311 and the corresponding electrode pads P in contact with each other under an appropriate pressure, thereby obtaining electrical conduction. In this state, the test head 313 outputs a predetermined electric signal to the chip T through the probe needles 311, and receives a return signal from the chip T, thereby measuring the electrical characteristics of the chip T. The probe inspection of the product concerning the non-defectiveness/defectiveness and the like is performed in this manner.

When the probe inspection of the first chip T of the first wafer W is completed, the chip T of this wafer W is moved downward together with the wafer chuck 305 and moved to immediately under the CCD camera 328 of the alignment unit 326. There, needle marks N (see FIGS. 24A and 24B) formed on the electrode pads P of this chip T during probe inspection are optically detected. Whether or not these needle marks N are within an allowable range H indicated by an alternate long-and-two-short-dashes line on the electrode pad P is inspected.

Detection of the needle mark position may be performed by utilizing techniques shown in, e.g., Jpn. Pat. Appln. KOKAI Publication Nos. 58-7973 and 61-228638. For example, the needle marks N are image-picked up by scanning with a CCD camera. The coordinates of the needle marks N are recognized from image data obtained by binarizing the picked-up image, thereby detecting the positions of the needle marks N.

When a needle mark N in the electrode pad P is within the allowable range H, even if the needle point of a probe needle 311 is displaced from the center of the electrode pad P more or less, the needle point will not contact the passivation edge around the electrode pad P, so that a needle mark trouble (a crack K or the like) will not be caused. The allowable range H is preferably set at, e.g., an inner area apart from the inner circumference of the passivation edge E around the electrode pad P by 10 microns.

As the result of needle mark inspection, if the position of the needle mark N is within the allowable range H, it is determined that the probe needle 311 will not contact the passivation edge E around the electrode pad P to cause a needle mark trouble. The wafer chuck 305 is directly returned to immediately under the probe card 310 in the same manner as described above. There, the respective electrode pads P of the second chip T of the wafer W are aligned with the probe needles 311. The wafer chuck 305 is moved upward in the Z direction to bring the electrode pads and probe needles 311 into contact with each other, and this chip T is subjected to probe inspection. Then, the wafer chuck 305 is moved for a distance corresponding to one chip, and the third chip T is subjected to probe inspection. In this manner, probe inspection of all the chips T is sequentially executed from the second chip.

Figure 24A:
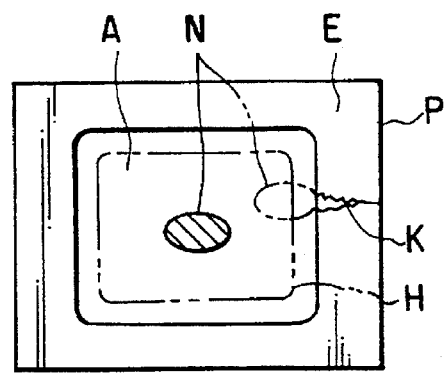
FIG. 24A and 24B show an enlarged plan view of one electrode pad of the chip of this semiconductor wafer, and an enlarged sectional view of this one electrode pad, respectively.
Figure 24B:
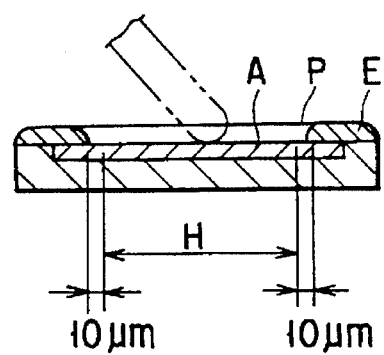

As the result of the inspection of the needle mark on the electrode pad P of the first chip T, if the position of a needle mark N is outside the allowable range H, as indicated by an alternate long-and-short-dash line in FIG. 24A, it is determined that the probe needle 311 will contact the passivation edge E around the electrode pad P to cause a needle mark trouble, e.g., a crack K. An alarm is generated, and the progress of the probe inspection is stopped.

When an alarm is generated, the operator attends to the probe apparatus to confirm the small displacement of the probe needles 311 from the electrode pads P of the chip T. The operator then performs correction in accordance with the cause of the displacement, e.g., he or her adjusts alignment, or installs, adjusts, or exchanges a probe card, and sets up the probe apparatus again, thereby resuming the operation in the same manner as before.

Note that sometimes correction can be performed by alignment depending on the cause of the small displacement of the probe needles 311 from the electrode pads P of the chip T. In this case, if the position of the needle mark is outside the allowable range, automatic alignment may be performed again based on the data indicating the result of needle mark inspection described above, thereby correcting the needle displacement.

As a result, occurrence of needle displacement from the electrode pad P of the chip T during probe inspection can be checked at an early stage, so that formation of a defective chip due to a needle mark trouble is prevented, thereby improving the manufacturing yield. At the same time, a cumbersome needle mark inspecting operation after probe inspection can be omitted.

The above needle mark inspection of the electrode pads P of the chip T of the wafer W may be performed for the first chip T of the first wafer W of each lot (including, e.g., 25 wafers) of the wafers W which are to be sequentially subjected to probe inspection. However, considering fatigue and the like of the probe needles 311 of the probe card 310, needle mark inspection is preferably performed after every several ones (e.g., after five wafers) of the wafers W which are to be sequentially subjected to probe inspection.

When the parts type of the wafer W as the inspection target is altered, the probe card 310 is naturally exchanged as well. Thus, needle mark inspection must be performed for the first chip T of at least the first wafer W after exchange of the probe card 310.

According to the auto-setup type probe inspecting method described above, by using an auto-setup type probe apparatus, inspection targets are automatically set on the inspection stage one by one and aligned, and the probe needles are brought into contact with the electrode pads of each of a large number of chips arranged on the inspection target, thereby performing probe inspection of this chip. After the first chip of at least the first inspection target is probe-inspected, the needle marks formed on the electrode pads of the chip by contact with the probe needles are optically detected, and whether or not each needle mark is within the allowable range of the electrode pad is inspected. As a result of needle mark inspection, if the position of a needle mark is within the allowable range, it is determined that the probe needle will not contact the passivation edge around the electrode pad to cause a needle mark trouble, and probe inspection of the chips is sequentially executed from the second chip. As a result of needle mark inspection, if the position of a needle mark is outside the allowable range, it is determined that the probe needle will contact the passivation edge around the electrode pad to cause a needle mark trouble, e.g., a crack. An alarm is produced, and the progress of the probe inspection is stopped. Thus, occurrence of needle displacement from the pad of the chip during probe inspection can be checked at an early stage, so that formation of a defective chip caused by a needle mark trouble can be prevented, thereby improving the manufacturing yield. At the same time, a cumbersome needle mark inspecting operation after probe inspection can be omitted, which is very effective in realization of automation of probe inspection.

As a result of the needle mark inspection described above, if the position of a needle mark is outside the allowable range, automatic alignment can be performed based on data indicating this fact, thereby correcting the needle displacement.

Since the auto-setup type probe inspecting method of this embodiment is performed in the above manner, an occurrence of needle displacement from the electrode pad during probe inspection of the chip of the inspection target can be checked at an early stage, and formation of a defective chip due to a needle mark trouble can be prevented, thereby improving the manufacturing yield. At the same time, a cumbersome needle mark inspecting operation after probe inspection can be omitted, which is very effective in realization of automation of probe inspection.

In the above embodiments, a probing operation performed for an integrated circuit chip formed on a semiconductor wafer has been described. However, the present invention can be similarly applied to inspection of a liquid crystal display having a plurality pads and electrodes formed on a glass substrate and the like.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probe apparatus comprising:
   means for holding a microelectronic element formed on a substrate and having a plurality of pads;
   a probe card having a plurality of probe needles;
   means for holding said probe card;
   image pick-up means for picking up images of the pads and the probe needles;
   registration means for previously storing pad position information indicating pad positions of at least specified pads of said pads and needle position information indicating needle positions of at least specified probe needles of said plurality of probe needles, the needle positions being obtained by an actual measurement based on the images picked up by said image pick-up means;
   a control processor for executing a task for forming imaginarily needle marks on said pads by overlapping said needle position information and the pad position information of the microelectronic element to obtain imaginary needle mark information, and a task for detecting a positional deviation between said needle marks and said pads on the basis of the imaginary needle mark information and the pad positions.

2. An apparatus according to claim 1, wherein said registration means stores another needle position information indicating positions, which are actually measured, of arbitrary probe needles other than said specified probe needles, said control processor detects another imaginary needle marks formed on said pads by imaginarily bringing said arbitrary probe needles and said pads corresponding thereto into contact with each other, by overlapping said another needle position information and the pad position information, and detects another positional deviation information indicating a positional deviation between said another imaginary needle marks and said pads corresponding to said arbitrary probe needles, and corrects a positional deviation between said pads and said arbitrary probe needles in accordance with the another positional deviation information.

3. An apparatus according to claim 2, which further includes a driving unit for moving said microelectronic element to said probe card in order to bring said pads of said microelectronic element and said probe needles actually into contact with each other and forming actual needle marks on said pads, and said control processor detects said actual needle marks formed on said pads of the microelectronic element on the basis of the image signal of said image pick-up means, detects positional deviation information indicating a positional deviation between said actual needle marks and said pads, and corrects a positional deviation between said pads and said probe needles in accordance with the positional deviation information.

4. An apparatus according to claim 3, wherein said control processor fixes said holding means holding said probe card and drives said driving unit for making the microelectronic element rotate, to perform θ correction of positions of said pads.

5. An apparatus according to claim 4, wherein said control processor corrects the positions of said pads with respect to said probe needles such that a sum of squares of positional deviation amounts between said needle marks and said pads becomes minimum.

6. An apparatus according to claim 1, wherein said image pick-up means has auto-focus means for focusing on distal ends of said probe needles by auto-focus, and said registration means stores coordinates corresponding to focussed ones of said probe needles as the needle position information.

7. An apparatus according to claim 6, which further includes means for automatically exchanging said probe card with another probe card.

8. An apparatus according to claim 7, wherein said means for automatically exchanging executes automatic exchange of said probe card under control of said control processor when said control processor detects that the positional deviation between said needle marks and said pads are outside a predetermined range.

9. An apparatus according to claim 1, wherein said microelectronic element includes one of a plurality of integrated circuit chips formed on a semiconductor wafer as said substrate.

10. An apparatus according to claim 1, wherein:
    said image pick up means includes an image sensor for image-picking up needle marks formed on said probe needles when said probe needles touch said pads to output an image signal; and
    said control processor includes a discrimination section for discriminating a contact state between said probes and said electrode pads on the basis of the image signal from said image sensor, said discrimination section including a calculator for calculating an area of each of the needle marks and a position thereof on the basis of the image signal from said image sensor to obtain needle mark area data and needle mark position data, a comparator for comparing the needle mark area data and needle mark position data obtained by said calculator with reference data, and a decision circuit for deciding a contact state between said probes and said electrode pads on the basis of at least one of the needle mark position reformation and the needle mark area data stored in said storage means.

11. An apparatus according to claim 10, wherein said calculator calculates a centroid position of the area of each of the needle marks, and said decision circuit decides whether or not the calculated area exceeds a predetermined value and the area centroid is included in a predetermined range.

12. An apparatus according to claim 10, wherein said calculator subtracts the previously formed needle mark including one overlapping portion from the sum of the area of the previously formed needle mark and the area of the needle mark formed the last time and said decision circuit decides the contact state on the basis of a result of said calculator.

13. An apparatus according to claim 10, wherein said discrimination section has an interpolating circuit for subjecting the image signal to an interpolation processing to compensate a partial lost of the needle mark.

14. An apparatus according to claim 1, wherein said control processor executes a task for correcting the positional deviation between said pads and said probe needles on the basis of positional deviation information corresponding to the positional deviation.

15. A probe apparatus comprising:

means for holding a microelectronic element formed on a substrate and having a plurality of pads;

a probe card having a plurality of probe needles;

means for holding said probe card;

image pick-up means for picking up images of the pads and the probe needles;

registration means for previously storing pad position coordinate data indicating pad positions of at least specified pads of said pads and needle position coordinate data indicating needle positions of at least specified probe needles of said plurality of probe needles, the needle positions being obtained by an actual measurement based on the images picked up by said image pick-up means;

a control processor for executing a task for forming imaginary needle marks on said pads by overlapping the needle position coordinate data and the pad position coordinate data to obtain imaginary needle mark coordinate data, and a task for detecting a positional deviation between said needle marks and said pads on the basis of the imaginary needle mark coordinate data and the pad position coordinate data to obtain positional deviation information.

16. An apparatus according to claim 15, wherein said control processor executes a task for correctly the positional deviation between said pads and said probe needles on the basis of the positional deviation information.

17. An apparatus according to claim 15, wherein said registration means stores another pad position coordinate data indicating positions, which are actually measured, of arbitrary probe needles other than said specified probe needles, said control processor detects another imaginary needle marks formed on said pads by overlapping said another needle position coordinated data and the pad position coordinate data, and detects another positional deviation information indicating a positional deviation between said another imaginary needle marks and said pads corresponding to said arbitrary probe needles, and corrects a positional deviation between said pads and said arbitrary probe needles on the basis of the another positional deviation information.

* * * * *